(12) United States Patent
Chen et al.

(10) Patent No.: US 7,998,307 B2
(45) Date of Patent: Aug. 16, 2011

(54) ELECTRON BEAM ENHANCED SURFACE WAVE PLASMA SOURCE

(75) Inventors: Lee Chen, Cedar Creek, TX (US); Paul Moroz, Marblehead, MA (US)

(73) Assignee: Tokyo Electron Limited, Tokyo (JP)

( * ) Notice: Subject to any disclaimer, the term of this patent is extended or adjusted under 35 U.S.C. 154(b) by 631 days.

(21) Appl. No.: 11/518,884

(22) Filed: Sep. 12, 2006

(65) Prior Publication Data

US 2008/0060759 A1    Mar. 13, 2008

(51) Int. Cl.
C23C 16/00 (2006.01)
C23C 14/00 (2006.01)
C23F 1/00 (2006.01)
H01L 21/306 (2006.01)
A62D 3/00 (2007.01)

(52) U.S. Cl. ..... 156/345.41; 118/723 MW; 204/157.43; 204/298.38

(58) Field of Classification Search ........ 118/723 MW; 156/345.41; 204/157.43, 298.38
See application file for complete search history.

(56) References Cited

U.S. PATENT DOCUMENTS

| | | | | |
|---|---|---|---|---|
| 5,024,716 A * | 6/1991 | Sato | ............ | 156/345.42 |
| 5,038,712 A * | 8/1991 | Fujiyama | ............ | 118/723 MW |
| 5,443,686 A * | 8/1995 | Jones et al. | ............ | 216/37 |
| 5,911,852 A * | 6/1999 | Katayama et al. | ............ | 156/345.41 |
| 6,280,563 B1 * | 8/2001 | Baldwin et al. | ............ | 156/345.48 |
| 6,656,540 B2 * | 12/2003 | Sakamoto et al. | ............ | 427/564 |
| 2002/0123200 A1 * | 9/2002 | Yamamoto et al. | ............ | 438/345 |
| 2003/0077883 A1 * | 4/2003 | Ohtake | ............ | 438/478 |
| 2003/0168436 A1 * | 9/2003 | Ohmi et al. | ............ | 219/121.43 |
| 2006/0065367 A1 * | 3/2006 | Chen et al. | ............ | 156/345.33 |
| 2006/0066247 A1 * | 3/2006 | Koshiishi et al. | ............ | 315/111.21 |
| 2006/0071607 A1 | 4/2006 | Chen et al. | | |

OTHER PUBLICATIONS

Korean Office Action in KR 10-2007-7007996 dated Mar. 15, 2011 (with English translation).
Korean Office Action issued Apr. 26, 2011, in Korean Patent Application No. 10-2007-7003455 (with English translation).

* cited by examiner

Primary Examiner — Parviz Hassanzadeh
Assistant Examiner — Rakesh Dhingra
(74) Attorney, Agent, or Firm — Oblon, Spivak, McClelland, Maier & Neustadt, L.L.P.

(57) ABSTRACT

A plasma processing system is described for generating plasma with a ballistic electron beam using a surface wave plasma (SWP) source, such as a radial line slot antenna (RLSA) during semiconductor device fabrication. The antenna comprises a resonator plate having a partially open, electrically conductive layer coupled to a surface of the resonator plate. For example, the electrically conductive layer is formed at an interface between the resonator plate and the plasma, and a direct current (DC) voltage is applied to the electrically conductive layer.

19 Claims, 19 Drawing Sheets

ELECTRON BEAM ENHANCED SURFACE WAVE PLASMA SOURCE

CROSS-REFERENCE TO RELATED APPLICATIONS

This application is related to pending U.S. patent application Ser. No. 10/953,802, entitled "Surface wave plasma processing system and method of using", filed on Sep. 30, 2004; pending U.S. patent application Ser. No. 10/954,086, entitled "Method for treating a substrate", filed on Sep. 30, 2004; pending U.S. patent application Ser. No. 10/953,801, entitled "Plasma processing system for treating a substrate", filed on Sep. 30, 2004; pending U.S. patent application Ser. No. 10/953,791, entitled "Method and system for improving coupling between a surface wave plasma source and a plasma space", filed on Sep. 30, 2004; and co-pending U.S. patent application Ser. No. 11/518,885, entitled "Radial line slot antenna utilizing an unstable resonator", filed on even date herewith. The entire contents of all of those applications are herein incorporated by reference in their entirety.

BACKGROUND OF THE INVENTION

1. Field of the Invention

The present invention relates to a surface wave plasma (SWP) source and, more particularly, to a radial line slot antenna (RLSA).

2. Description of Related Art

Typically, during semiconductor processing, a (dry) plasma etch process is utilized to remove or etch material along fine lines or within vias or contacts patterned on a semiconductor substrate. The plasma etch process generally involves positioning a semiconductor substrate with an overlying patterned, protective layer, for example a photoresist layer, into a processing chamber.

Once the substrate is positioned within the chamber, an ionizable, dissociative gas mixture is introduced within the chamber at a pre-specified flow rate, while a vacuum pump is throttled to achieve an ambient process pressure. Thereafter, a plasma is formed when a portion of the gas species present are ionized following a collision with an energetic electron. Moreover, the heated electrons serve to dissociate some species of the mixture gas species and create reactant specie(s) suitable for the exposed surface etch chemistry. Once the plasma is formed, any exposed surfaces of the substrate are etched by the plasma. The process is adjusted to achieve optimal conditions, including an appropriate concentration of desirable reactant and ion populations to etch various features (e.g., trenches, vias, contacts, etc.) in the exposed regions of substrate. Such substrate materials where etching is required include silicon dioxide ($SiO_2$), poly-silicon and silicon nitride, for example.

Conventionally, various techniques have been implemented for exciting a gas into plasma for the treatment of a substrate during semiconductor device fabrication, as described above. In particular, ("parallel plate") capacitively coupled plasma (CCP) processing systems, or inductively coupled plasma (ICP) processing systems have been utilized commonly for plasma excitation. Among other types of plasma sources, there are microwave plasma sources (including those utilizing electron-cyclotron resonance (ECR)), surface wave plasma (SWP) sources, and helicon plasma sources.

It is becoming common wisdom that SWP sources offer improved plasma processing performance, particularly for etching processes, over CCP systems, ICP systems and resonantly heated systems. SWP sources produce a high degree of ionization at a relatively lower Boltzmann electron temperature ($T_e$). In addition, SWP sources generally produce plasma richer in electronically excited molecular species with reduced molecular dissociation. However, the practical implementation of SWP sources still suffers from several deficiencies.

SUMMARY OF THE INVENTION

According to one embodiment, a system for generating an electron beam to enhance a surface wave plasma (SWP) source in a plasma processing system is provided.

According to another embodiment, a system for enhancing the robustness of a surface wave plasma (SWP) source in a plasma processing system is provided.

According to another embodiment, a system for adjusting the spatial uniformity of a surface wave plasma (SWP) source in a plasma processing system is provided.

According to another embodiment, a plasma processing system configured to etch a substrate is described, comprising: a plasma processing chamber configured to facilitate the formation of plasma from process gas introduced therein; a substrate holder coupled to the plasma processing chamber and configured to support the substrate; an electromagnetic (EM) wave launcher coupled to the plasma processing chamber and configured to couple EM energy in a desired EM wave mode to a plasma by generating a surface wave on a plasma surface of the EM wave launcher adjacent the plasma; a power coupling system coupled to the EM wave launcher and configured to provide the EM energy to the EM wave launcher for forming the plasma; an electrically conductive layer coupled to the plasma surface of the EM wave launcher, wherein the electrically conductive layer comprises a plurality of openings to permit the passage of EM energy therethrough; and a direct current (DC) power system coupled to the electrically conductive layer and configured to couple a DC voltage to the electrically conductive layer in order to form a ballistic electron beam.

DETAILED DESCRIPTION OF EXEMPLARY EMBODIMENTS

In the following description, to facilitate a thorough understanding of the invention and for purposes of explanation and not limitation, specific details are set forth, such as a particular geometry of the plasma processing system and various descriptions of the system components. However, it should be understood that the invention may be practiced with other embodiments that depart from these specific details.

Nonetheless, it should be appreciated that, contained within the description are features which, notwithstanding the inventive nature of the general concepts being explained, are also of an inventive nature.

Figure 1A:
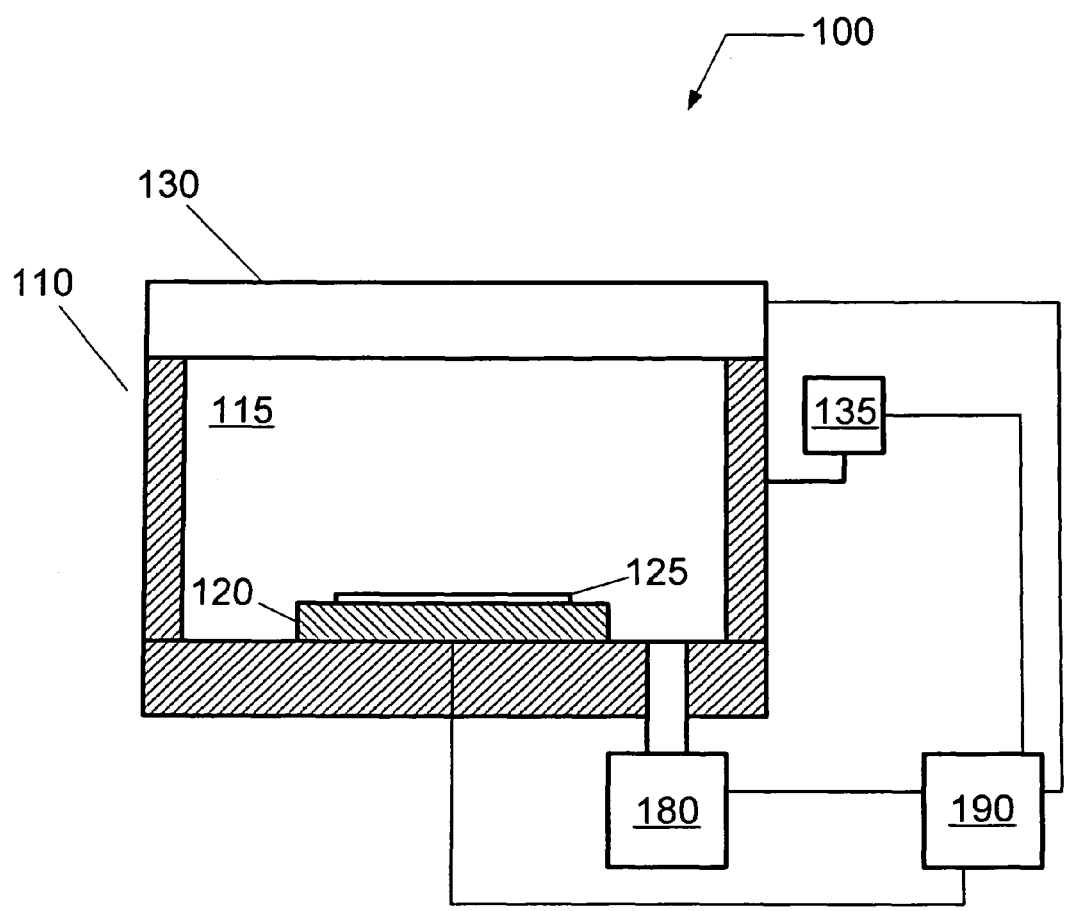
FIG. 1A presents a simplified schematic representation of a plasma processing system according to an embodiment of the invention.

Referring now to the drawings, wherein like reference numerals designate identical or corresponding parts throughout the several views, FIG. 1A illustrates a plasma processing system 100 according to an embodiment. The plasma processing system 100 may comprise a dry plasma etching system or a plasma enhanced deposition system.

The plasma processing system 100 comprises a processing chamber 110 configured to define a process space 115. The processing chamber 110 comprises a substrate holder 120 configured to support a substrate 125. Therein, the substrate 125 is exposed to plasma or process chemistry in process space 115. Furthermore, the plasma processing system 100 comprises a plasma source 130 coupled to the processing chamber 110, and configured to form plasma in the process space 115. The plasma source 130 comprises a surface wave plasma (SWP) source, such as a radial line slot antenna (RLSA), to be discussed below.

As seen in FIG. 1A, the plasma processing system 100 comprises a gas supply system 135 coupled to the processing chamber 110 and configured to introduce a process gas to process space 115. During dry plasma etching, the process gas may comprise an etchant, a passivant, or an inert gas, or a combination of two or more thereof. For example, when plasma etching a dielectric film such as silicon oxide ($SiO_x$) or silicon nitride ($Si_xN_y$), the plasma etch gas composition generally includes a fluorocarbon-based chemistry ($C_xF_y$) such as at least one of $C_4F_8$, $C_5F_8$, $C_3F_6$, $C_4F_6$, $CF_4$, etc., and/or may include a fluorohydrocarbon-based chemistry ($C_xH_yF_z$) such as at least one of $CHF_3$, $CH_2F_2$, etc., and can have at least one of an inert gas, oxygen, CO or $CO_2$. Additionally, for example, when etching polycrystalline silicon (polysilicon), the plasma etch gas composition generally includes a halogen-containing gas such as HBr, $Cl_2$, $NF_3$, or SF6 or a combination of two or more thereof, and may include a fluorohydrocarbon-based chemistry ($C_xH_yF_z$) such as at least one of $CHF_3$, $CH_2F_2$, etc., and at least one of an inert gas, oxygen, CO or $CO_2$, or two or more thereof. During plasma enhanced deposition, the process gas may comprise a film precursor, a reduction gas, or an inert gas, or a combination of two or more thereof.

Furthermore, the plasma processing system 100 includes a pumping system 180 coupled to the processing chamber 110, and configured to evacuate the processing chamber 110, as well as control the pressure within the processing chamber 110. Optionally, the plasma processing system 100 further includes a control system 190 coupled to the processing chamber 110, substrate holder 120, plasma source 130, gas supply system 135, and the pumping system 180. The control system 190 can be configured to execute a process recipe for performing at least one of an etch process, and a deposition process in the plasma processing system 100.

Referring still to FIG. 1A, the plasma processing system 100 may be configured to process 200 mm substrates, 300 mm substrates, or larger-sized substrates. In fact, it is contemplated that the plasma processing system may be configured to process substrates, wafers, or LCDs regardless of their size, as would be appreciated by those skilled in the art. Therefore, while aspects of the invention will be described in connection with the processing of a semiconductor substrate, the invention is not limited solely thereto.

As described above, the processing chamber 110 is configured to facilitate the generation of plasma in process space 115, and generate process chemistry in process space 115 adjacent a surface of the substrate 125. For example, in an etch process, the process gas can include molecular constituents that when dissociated are reactive with the material being etched on the substrate surface. Once plasma is formed in the process space 115, heated electrons can collide with molecules in the process gas causing dissociation and the formation of reactive radicals for performing an etch process, for example.

Figure 1B:
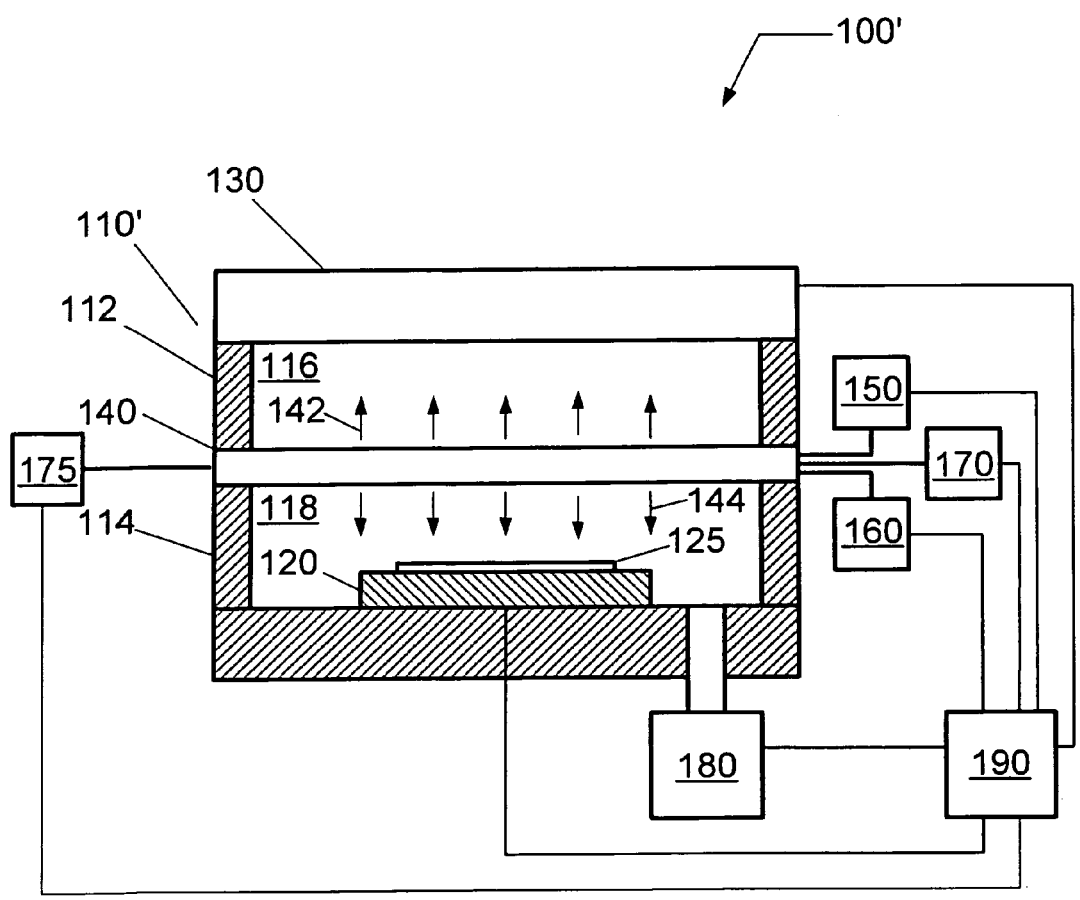
FIG. 1B presents a simplified schematic representation of a plasma processing system according to another embodiment of the invention.

Referring now to FIG. 1B, a plasma processing system 100' is presented according to another embodiment. Plasma processing system 100' comprises a processing chamber 110' having an upper chamber portion 112 (i.e. a first chamber portion) configured to define a plasma space 116, and a lower chamber portion 114 (i.e. a second chamber portion) configured to define a process space 118. In the lower chamber portion 114, the processing chamber 110 comprises a substrate holder 120 configured to support a substrate 125. Therein, the substrate 125 is exposed to process chemistry in process space 118. Furthermore, the plasma processing system 100 comprises a plasma source 130 coupled to the upper chamber portion 112, and configured to form plasma in the plasma space 116. The plasma source 130 comprises a surface wave plasma (SWP) source, such as a radial line slot antenna (RLSA), to be discussed below.

As seen in FIG. 1B, the plasma processing system 100' comprises a gas injection grid 140 coupled to the upper chamber portion 112 and the lower chamber portion 114, and located between the plasma space 116 and the process space 118. While FIG. 1B shows the gas injection grid 140 positioned centrally to divide the processing chamber such that the upper chamber portion 112 is substantially equal in size to the lower portion 114, the invention is not limited to this configuration. For example, the gas injection grid 140 can be located within 200 mm from the upper surface of the substrate and, desirably, the gas injection grid is placed within a range of approximately 10 mm to approximately 150 mm from the upper surface of the substrate. In the embodiment of FIG. 1B, the grid separating the upper chamber 112 from the lower chamber 114 is a gas injection grid 140 configured to introduce a first gas 142 to the plasma space 116 for forming plasma, and to introduce a second gas 144 to the process space 118 for forming process chemistry. However, it is not necessary for the first and second gasses to be introduced to their respective chamber portions by way of the grid 140. For example, the plasma source 130 may be configured to supply the first gas 142 to the plasma space 116. More generally, a grid may be used which supplies no gas to the chamber 110', or which supplies one or both of the first and second gas. In embodiment of FIG. 1B, a first gas supply system 150 is coupled to the gas injection grid 140, and it is configured to supply the first gas 142. Moreover, a second gas supply system 160 is coupled to the gas injection grid 140, and it is configured to supply the second gas 144. The temperature of the gas injection grid 140 can be controlled using a temperature control system 170, and the electric potential of the gas injection grid 140 can be controlled using an electric bias control system 175.

Furthermore, the plasma processing system 100' includes a pumping system 180 coupled to the processing chamber 110, and configured to evacuate the processing chamber 110', as well as control the pressure within the processing chamber 110'. Optionally, the plasma processing system 100' further includes a control system 190 coupled to the processing chamber 110', substrate holder 120, plasma source 130, gas injection grid 140, the first gas supply system 150, the second gas supply system 160, the temperature control system 170, the electric bias control system 175, and the pumping system 180. The control system 190 can be configured to execute a process recipe for performing at least one of an etch process, and a deposition process in the plasma processing system 100'.

Referring still to FIG. 1B, the plasma processing system 100' may be configured to process 200 mm substrates, 300 mm substrates, or larger-sized substrates. In fact, it is contemplated that the plasma processing system may be configured to process substrates, wafers, or LCDs regardless of their size, as would be appreciated by those skilled in the art. Therefore, while aspects of the invention will be described in connection with the processing of a semiconductor substrate, the invention is not limited solely thereto.

As described above, the processing chamber 110 is configured to facilitate the generation of plasma in plasma space 116, and generate process chemistry in process space 118 adjacent a surface of the substrate 125. The first gas 142, which is introduced to the plasma space 116, comprises plasma forming gas, or an ionizable gas or mixture of gases. The first gas 142 can include an inert gas, such as a Noble gas. The second gas 144, which is introduced to the process space 118, comprises a process gas or mixture of process gases. For example, in an etch process, the process gas can include molecular constituents that when dissociated are reactive with the material being etched on the substrate surface. Once plasma is formed in the plasma space 116, some of the plasma can diffuse into the process space 118 through the gas injection grid 140. The heated electrons having diffused into the process space 118, can collide with molecules in the process gas causing dissociation and the formation of reactive radicals for performing an etch process, for example.

Separate plasma and process spaces such as that shown in exemplary plasma processing system of FIG. 1B may provide improved process control over conventional systems. Specifically, the use of a gas injection grid 140, as described above, can, for example, affect the formation of dense, low (to moderate) temperature (i.e., electron temperature $T_e$) plasma in the plasma space 116, while producing a less dense, lower temperature plasma in the process space 118. In doing so, the split injection scheme for the first and second gases can affect a further reduction in the dissociation of the molecular composition in the second gas that is utilized for forming the process chemistry, which provides greater control over the process at the substrate surface.

Additionally, the configuration of exemplary FIG. 1B can reduce damage to chamber components such as the plasma source 130, by preventing process gasses from entering the plasma space 116. For example, as an inert gas (first gas), such as argon (Ar), is introduced to the plasma space 116, plasma is formed and neutral Ar atoms are heated. The heated Ar neutral atoms diffuse downwards through the gas injection grid 140, and enter the cooler process space proximate the substrate. This diffusion of neutral gas creates a gas flow into the process space 118 that can reduce or eliminate back-diffusion of the molecular composition in the process gas (second gas).

Still further, the configuration of FIG. 1B can reduce substrate damage caused by ion and electron interaction with the substrate 125. In particular, the diffusion of electrons and ions through the injection grid 140 into the process space 118 provides fewer electrons and ions in this space relative to the chamber described in FIG. 1A above. Moreover, many of these electrons and ions give up their energy to the dissociation of the process gas. Thus, fewer electrons and ions are available to interact with the substrate and cause damage thereto which is particularly important for low temperature processes because damage to the substrate 125 may not be annealed by the required process temperature.

Figure 2:
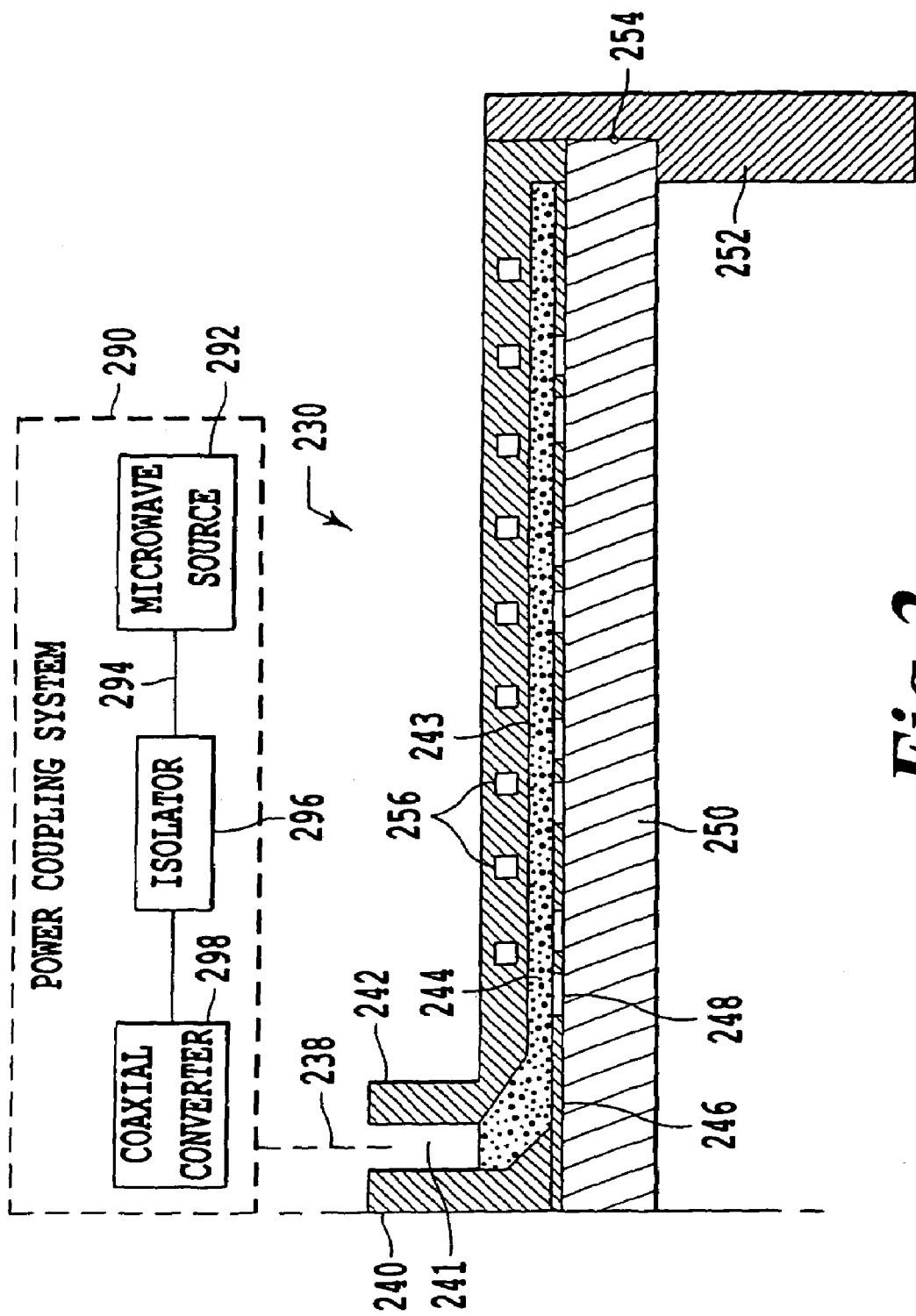
FIG. 2 presents a simplified schematic representation of a plasma source that can be used for the plasma processing system depicted in FIGS. 1A and 1B in accordance with one embodiment.

Referring now to FIG. 2, a partial cross-section of an antenna of the RLSA type is provided. A plasma source 230 is illustrated comprising a slot antenna with a coaxial feed 238 having an inner conductor 240, an outer conductor 242, and insulation 241. A fluid channel 256 can be used to flow a temperature control fluid for temperature control of the plasma source 230.

Additionally, the plasma source 230 includes an electromagnetic (EM) wave launcher 243 comprising a slow wave plate 244, a slot antenna 246 having slots 248, and a resonator plate 250. The number of slots, geometry of the slots, the size of the slots, and the distribution of the slots are all factors that can contribute to the spatial uniformity of the plasma formed in process space 115 (see FIG. 1A) or plasma space 116 (see FIG. 1B). Thus, the design of the slot antenna 246 may be used to control the spatial uniformity of the plasma in process space 115 (see FIG. 1A) or plasma space 116 (see FIG. 1B). However, design of the slot antenna to control plasma uniformity is complex and expensive. Moreover, although the exact dimensions of the resonator plate 250 (i.e., thickness, and diameter) can be calculated numerically for a desired microwave frequency, these critical dimensions of the resonator plate 250 also make this component expensive to produce.

The wave launcher 243 includes a microwave launcher configured to radiate microwave power into process space 115 (see FIG. 1A) or plasma space 116 (see FIG. 1B). The microwave launcher can be coupled to a power coupling system 290. The power coupling system 290 can involve a microwave source 292, such as a 2.45 GHz microwave power source, wherein microwave power is coupled to the microwave launcher via the coaxial feed 238. Microwave energy generated by the microwave source is guided through a waveguide 294 to an isolator 296 for absorbing microwave energy reflected back to the microwave oscillator, and thereafter it is converted to a coaxial TEM mode via a coaxial converter 298. A tuner may be employed for impedance matching, and improved power transfer. The microwave energy is coupled to the microwave launcher via the coaxial feed 238, where another mode change occurs from the TEM mode in the coaxial feed 238 to a TM mode. Additional details regarding the design of the coaxial feed and the wave launcher can be found in U.S. Pat. No. 5,024,716, entitled "Plasma processing apparatus for etching, ashing, and film-formation"; the content of which is herein incorporated by reference in its entirety.

Referring still to FIG. 2, the plasma source 230 is coupled to the upper chamber portion 112 of processing chamber 110, wherein a vacuum seal can be formed between the upper chamber wall 252 and the plasma source 230 using a sealing device 254. The sealing device 254 can include an elastomer O-ring, however, other known sealing mechanisms may be used.

In general, the inner conductor 240 and the outer conductor 242 of the coaxial feed 238 comprise a conductive material, such as a metal, while the slow wave plate 244 and the resonator plate 250 comprise a dielectric material. In the latter, the slow wave plate 244 and the resonator plate 250 preferably comprise the same material; however, different materials may be used. The material selected for fabrication of the slow wave plate 244 and the resonator plate 250 is chosen to reduce the wavelength of the propagating electromagnetic (EM) wave relative to the free-space wavelength, and the dimensions of the slow wave plate 244 and the resonator plate 250 are chosen to ensure the formation of a standing wave effective for radiating EM energy into process space 115 (See FIG. 1A) or plasma space 116 (see FIG. 1B).

The slow wave plate 244 and the resonator plate 250 can be fabricated from quartz (silicon dioxide). In particular, when the plasma processing system is utilized for etch process applications, quartz is often chosen for compatibility with the etch process. However, the present inventors have observed several problems with using quartz as the material of the slow wave plate 244 and the resonator plate 250 in conventional RLSA systems.

Figure 3:
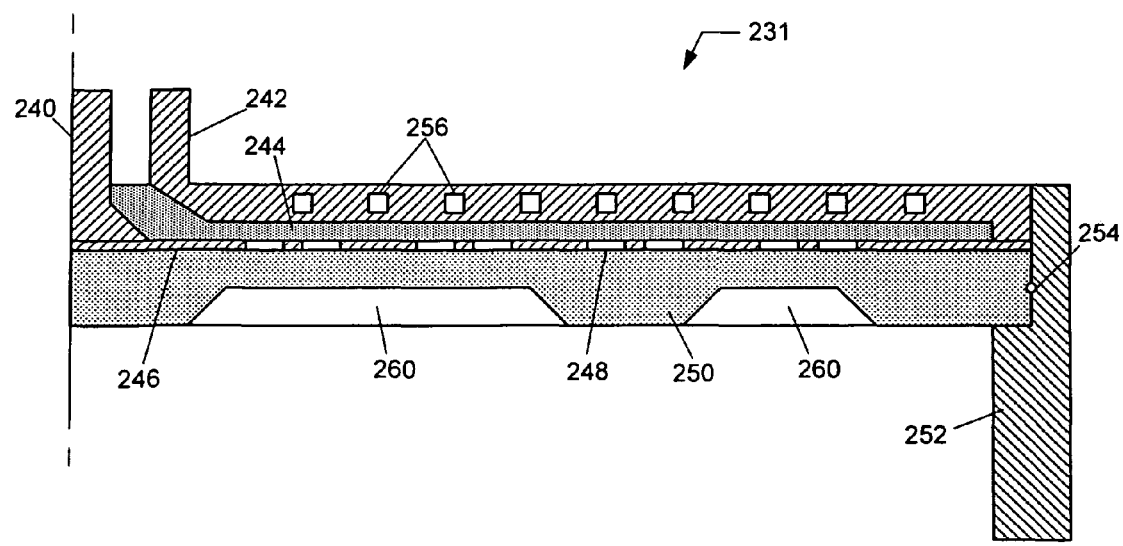
FIG. 3 presents another simplified schematic representation of a plasma source that can be used for the plasma processing system depicted in FIGS. 1A and 1B in accordance with another embodiment.

Firstly, the onset of the standing wave electric field must remain adjacent the quartz (resonator plate)-plasma interface for low power plasma processes. Additionally, the present inventors have observed that the use of a quartz resonator plate with the standing wave at the quartz-plasma interface can be prone to mode jumps as plasma parameters shift. Specifically, shifts in plasma parameters affect the decaying electric field in the quartz resonator. If the electric field strength in the dielectric resonator is not sufficiently larger than the change in the electric field due to the shift in plasma parameters, such a shift can cause a voltage standing wave ratio (VSWR) jump, or standing wave mode jump. Also, when using quartz as the material for the manufacture of the resonator plate and the slow wave plate, the design of the slot antenna (i.e., number of slots, their size, geometry and distribution) is less effective for affecting spatially uniform plasma in process space 115 (See FIG. 1A) or plasma space 116 (see FIG. 1B). Therefore, a special shape can be required for forming uniform plasma. FIG. 3 shows a plasma source 231 that can further include one or more concentric grooves 260 configured to improve the spatial uniformity of plasma in process space 115 (see FIG. 1A) or plasma space 116 (see FIG. 1B). However, this configuration can increase the cost of the quartz resonator plate.

One approach to avoid complex designs for the resonator plate 250 and to increase the effectiveness of the slot pattern in the slot antenna 246 includes using high dielectric constant (high-k) materials for the resonator plate 250. The slow wave plate 244 and the resonator plate 250 can be fabricated from a high-k material, for example. As used herein, "high dielectric constant" and "high-k" material refer to materials having a dielectric constant equal to or greater than that of silicon dioxide (approximately a value of 3.9). The present inventors have recognized that the use of a high-k material can, for example, lead to reduced risk of mode jumping due to shifts in plasma parameters relative to other materials such as quartz described above. Moreover, use of the high-k material causes the design of the slot antenna to have improved effectiveness in controlling the spatial uniformity of plasma formed in process space 115 (see FIG. 1A) or plasma space 116 (see FIG. 1B). Still further, use of a high-k material can allow reduced dissociation of the molecular constituent in the process chemistry, thereby allowing greater process control as discussed above with respect to FIGS. 1A and 1B. In this regard, the present inventors have recognized that the use of a high-k material for the slow wave plate 244 and the resonator plate 250 can improve process control in the single chamber configuration of exemplary FIG. 1A as well as the split chamber configuration of exemplary FIG. 1B.

For example, the high-k material can include intrinsic crystal silicon, alumina ceramic, aluminum nitride, and sapphire. However, other high-k materials may be used in accordance with the present invention. Moreover, a particular high-k material may be selected in accordance with the parameters of a particular process. For example, when the resonator plate 250 is fabricated from intrinsic crystal silicon, the plasma frequency exceeds 2.45 GHz at a temperature of 45 degrees C. Therefore, intrinsic crystal silicon is appropriate for low temperature processes (i.e., less than 45 degrees C.). For higher temperature processes, the resonator plate 250 can be fabricated from alumina ($Al_2O_3$), or sapphire.

As described above, the resonator plate of the plasma source has critical dimensions, which makes the resonator plate expensive, particularly where grooves are included in the resonator plate to improve plasma uniformity. This is true of quartz resonator plates as well as resonator plates made of the high-k materials described above. However, the erosive nature of plasma in process space 115 (see FIG. 1A) or plasma space 116 (see FIG. 1B) may cause the resonator plate 250 to deviate from its critical dimensions, thereby requiring frequent replacement of the expensive resonator plate 250.

In order to produce a high-Q (quality factor) resonator plate, the thickness of the resonator plate is chosen precisely to be an integer number of half wavelengths in order to support a standing wave. As a result, a relatively stronger evanescent electric field is achieved at the plasma interface (which is responsible for heating the plasma). However, as the resonator plate erodes due to operation, and the thickness of the resonator plate deviates from the integer number of half wavelengths, the Q of the resonator plate degrades. Consequently, the standing wave's evanescent electric field is reduced.

Additionally, in regions where the Q is locally degraded as a result of resonator plate erosion, a potentially greater degree of (microwave) power reflection (in an over-dense plasma regime) can occur depending on local plasma parameters that, in turn, affects (microwave) power delivery. Furthermore, the radial variation of plasma density generated by a RLSA, such as the antenna depicted in FIG. 2, can be inherently non-uniform (peaked in the center) due to greater losses at the edge of the antenna associated with the proximity of the chamber wall. One approach to compensate for this non-uniform variation in the plasma density is to alter the distribution of slots 248 in the slot antenna 246. Another approach to compensate for this non-uniform variation in the plasma density is to vary the thickness of the resonator plate 250 as illustrated in FIG. 3. However, as described above, each approach suffers from some deficiencies.

Figure 4:
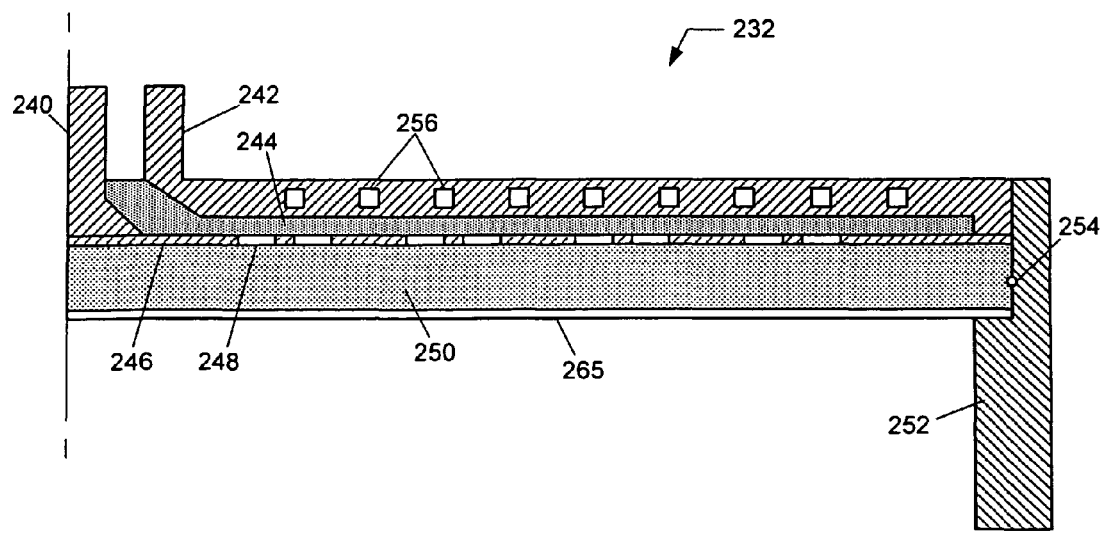
FIG. 4 presents another simplified schematic representation of a plasma source that can be used for the plasma processing system depicted in FIGS. 1A and 1B in accordance with another embodiment.

One approach to counter the erosive nature of the plasma includes the use of a cover plate as a consumable component to protect the more expensive resonator plate 250. Thus, according to yet another example, a cover plate 265 is coupled to a lower surface of the resonator plate 250 as illustrated in FIG. 4. The cover plate thickness is selected to be sufficiently thin such that it does not support standing wave modes within it (i.e., the thickness is not electromagnetically critical); however, it is sufficiently thick for mechanical stability. For example, the cover plate 265 can include a quartz cover plate that is 1 to 5 mm in thickness, or desirably 2 to 3 mm in thickness. Furthermore, the lower surface (or contact surface) of the resonator plate 250 and the upper surface (or contact surface) of the cover plate 265 can be polished to ensure a good contact between the resonator plate 250 and the cover plate 265. A thin film may also be deposited on the lower surface of the resonator plate 250, and polished in order to provide a good contact. For instance, the thin film can include a thin film of $SiO_2$, and it may include up to 2 micron thermal $SiO_2$, or up to 6 micron physical vapor deposition (PVD) $SiO_2$. As would be understood by one of ordinary skill in the art, the cover plate 265 is preferably coupled to the resonator plate by fasteners or some other mechanism for allowing removal and replacement of the cover plate 265. Additional details are provided in pending U.S. patent application Ser. No. 10/953,802, entitled "Surface wave plasma processing system and method of using", filed on Sep. 30, 2004; the entire contents of which are incorporated herein by reference in their entirety.

While the cover plate 265 can protect the resonator plate, such plate may require frequent replacement due to its relatively thin dimensions. Further, the cover plate cannot itself control uniformity of the plasma. Thus, several issues must be addressed in the manufacture of the RLSA source including, but not limited to: (i) preservation of the resonator plate Q, (ii) control of the plasma density non-uniformity, and (iii) erosion protection for the expensive resonator plate.

Figure 5:
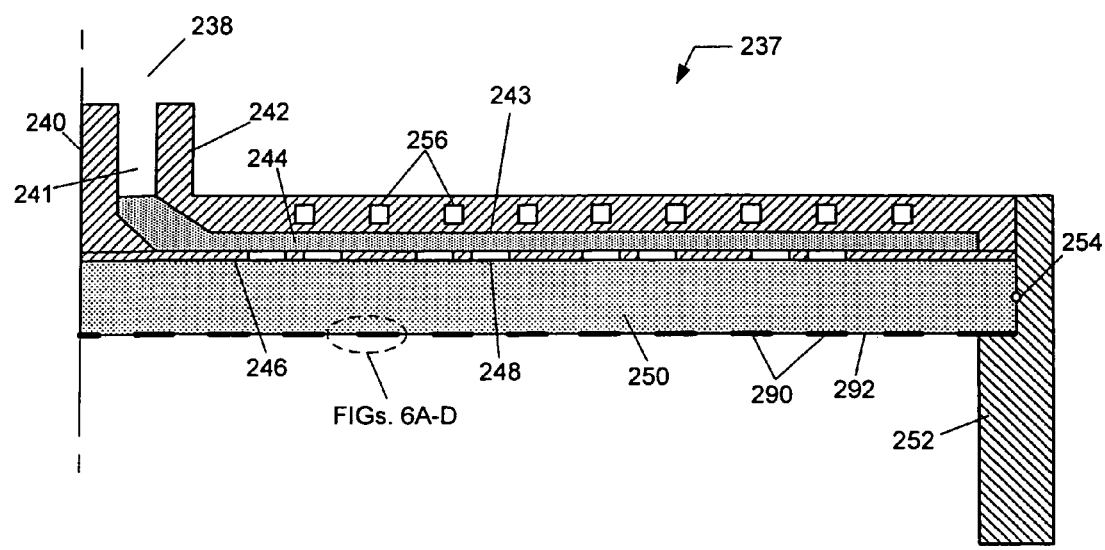
FIG. 5 presents another simplified schematic representation of a plasma source that can be used for the plasma processing system depicted in FIGS. 1A and 1B in accordance with yet another embodiment.

Referring now to FIG. 5, a partial cross-section of a RLSA plasma source is provided according to an embodiment of the present invention. A plasma source 237 is illustrated comprising a slot antenna having similar or like components as depicted in FIGS. 2 through 4 wherein like reference numerals designate identical or corresponding parts. Plasma source 237 further comprises an electrically conductive layer 290 coupled to the resonator plate 250 at the plasma surface of the resonator plate 250, wherein the electrically conductive layer 290 comprises a plurality of openings 292 to permit the passage of EM energy there-through. Thus the plurality of openings pass EM energy at discrete regions of the EM wave launcher.

Referring to FIGS. 6A through 6D, the electrically conductive layer 290 comprises a plurality of openings 292 to permit the passage of EM energy to the plasma in process space 115 (see FIG. 1A) or plasma space 116 (see FIG. 1B). The resonator plate 250 demonstrates a high Q in regions where the electrically conductive layer 290 extends because the thickness of the resonator plate is protected from erosion in these regions, and a relatively lower Q in regions where openings 292 exist (if the thickness of the resonator plate is different in these regions due to erosion). Additionally, the high Q regions do not permit coupling of power to the plasma, while the relatively lower Q regions (i.e., openings 292) permit the coupling of power to the plasma. While the resonator plate can be eroded in areas of openings 292, such erosion will not degrade the Q of the resonator plate to the same extent as if no conductive layer were present. This is believed to be due to less erosion in the discrete openings than would occur across the unprotected resonator plate, and/or due to the tendency for erosion of the resonator plate to be evenly dispersed among the openings. Further, the present inventors have recognized that the conductive layer limits coupling of electromagnetic energy from the antenna to the plasma through only the openings in the conductive layer, which can improve characteristics of the plasma. Generally, higher coupling to the plasma makes the resonator plate more susceptible to plasma changes and vice versa. Thus, the reduced coupling of the antenna due to the presence of the conductive layer can reduce plasma mode hopping of the resonator plate and can otherwise stabilize operation of the resonator plate and/or plasma.

Figure 6A:
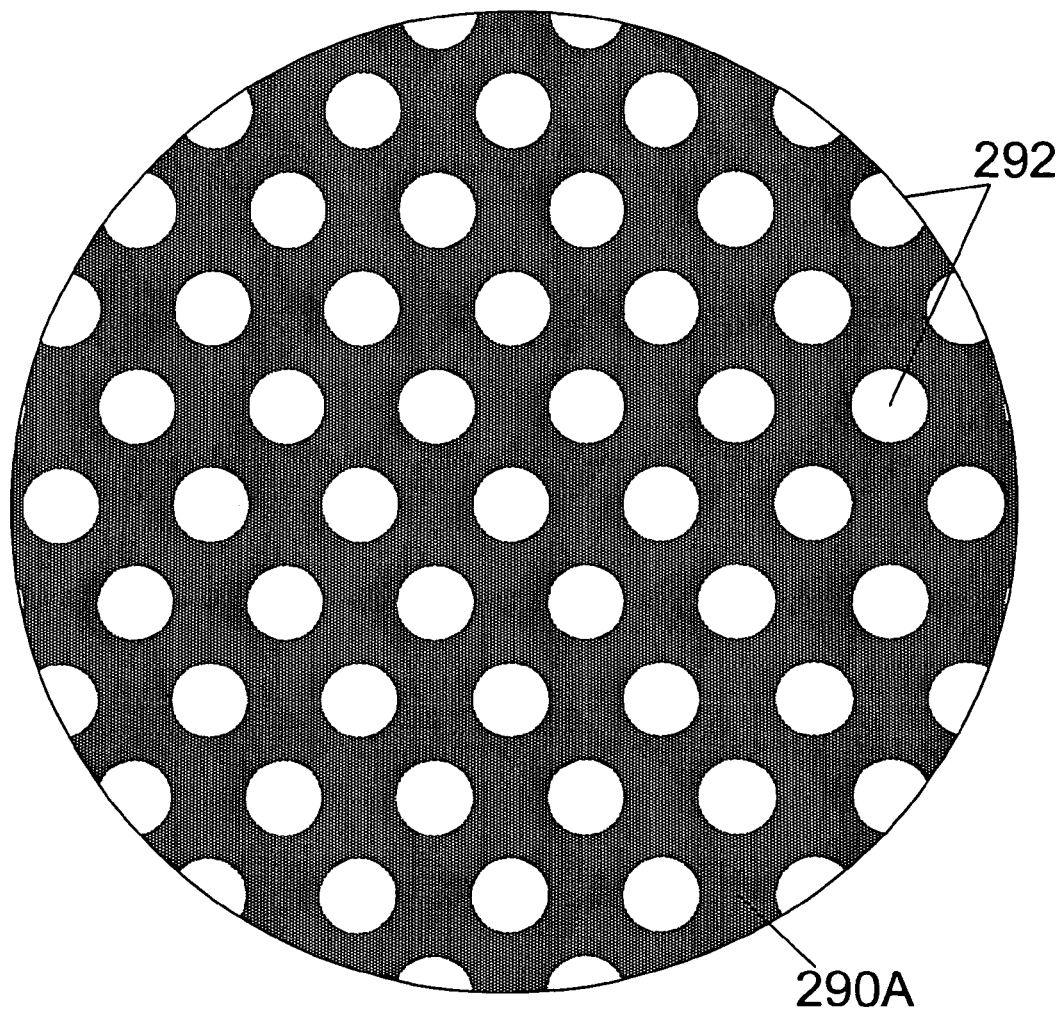
FIGS. 6A through 6D provide en exploded cross-sectional view of a plasma source according to several embodiments.
Figure 6B:
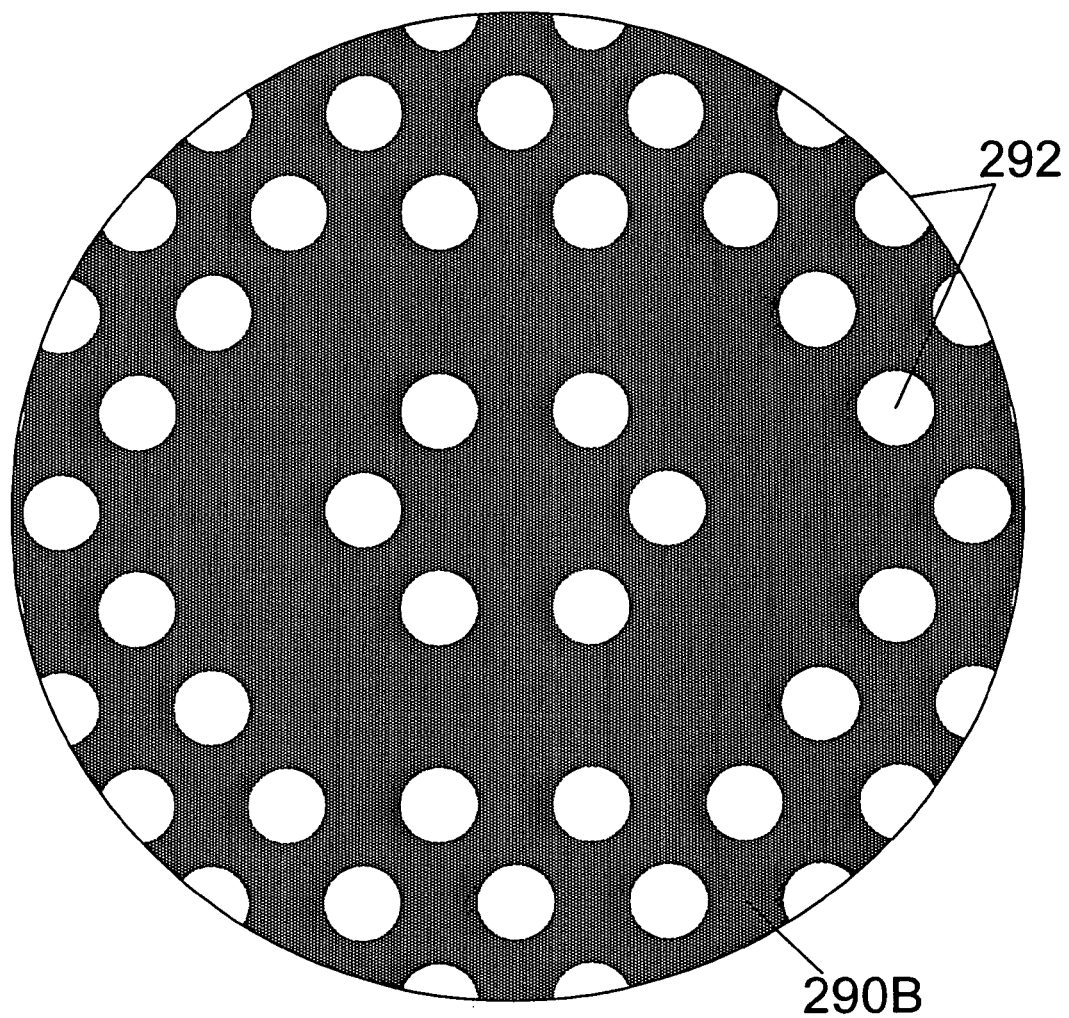
Figure 6C:
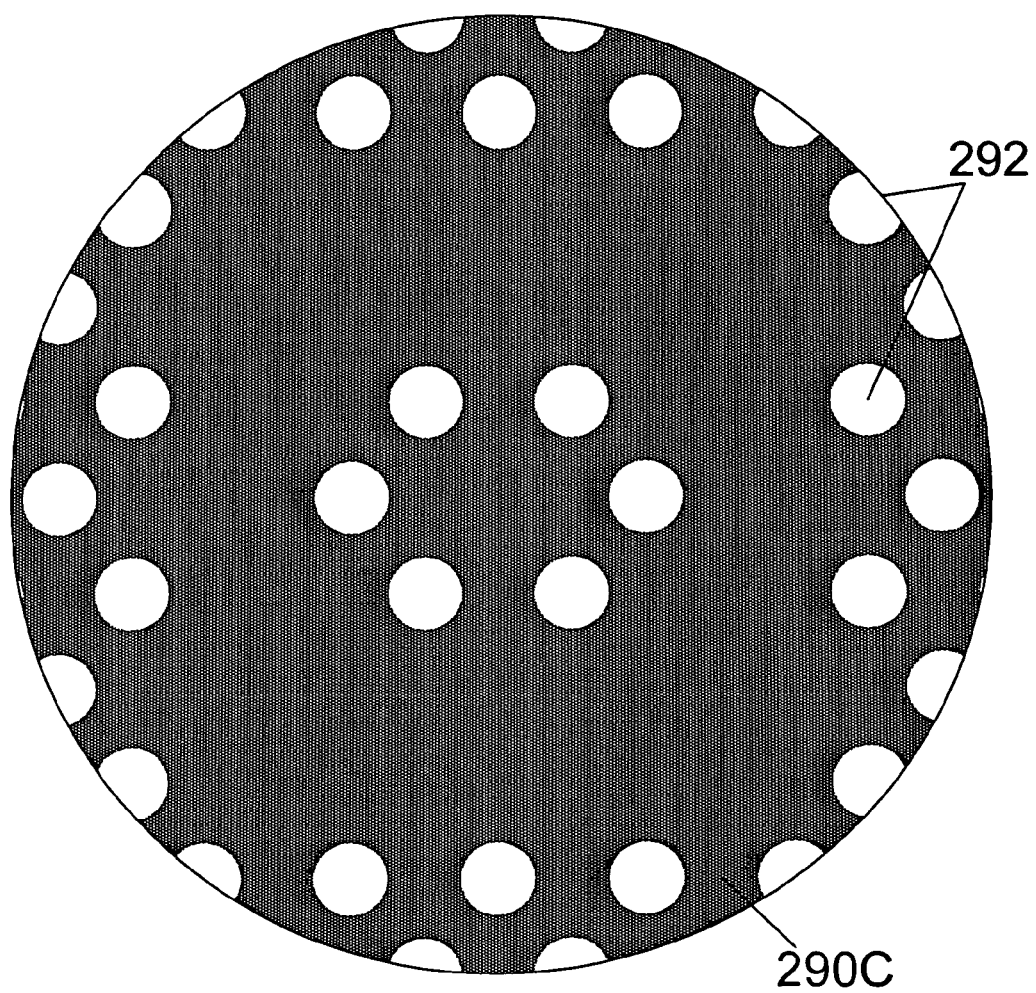
Figure 6:
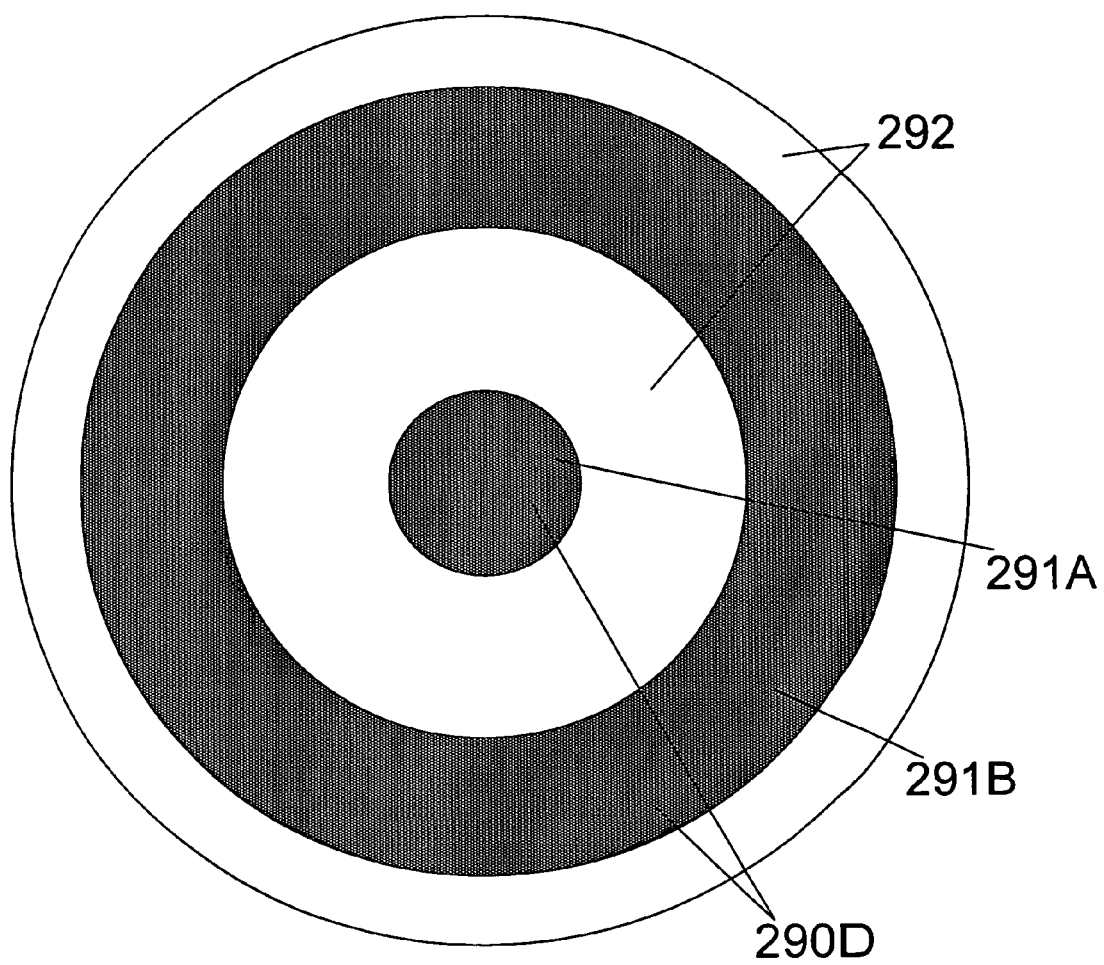

As illustrated in FIG. 6A, the openings 292 may be distributed uniformly across an electrically conductive layer 290A. As discussed above, however, the plasma produced from a RLSA can be inherently non-uniform. The present inventors have discovered that the conductive layer can also be used to control uniformity of the plasma. Thus, as illustrated in FIG. 6B, the openings 292 may be distributed non-uniformly across an electrically conductive layer 290B. For example, the openings 292 may be concentrated towards the edge of the RLSA in order to compensate for edge losses, such as wall losses in the processing chamber. FIG. 6C illustrates an additional embodiment for a non-uniform distribution of the openings 292 in an electrically conductive layer 290C. In FIGS. 6A through 6C, the electrically conductive layer 290A, 290B, 290C is DC-continuous. The diameter of each opening 292 may, for example, be a fraction of a (slow-wave) wavelength or an integer number of half wavelengths. For instance, the diameter of each opening 292 may be approximately a half-wavelength. This configuration is merely an example, and should not limit the scope of the invention.

Alternatively, an electrically conductive layer 290D may not be DC-continuous as shown in FIG. 6D. Each region of the electrically conductive layer 290D in FIG. 7D may be a specific width. For example, the diameter of the inner region 291A of electrically conductive layer 290D may be approximately a (slow-wave) wavelength, while the width of the outer region 291B of electrically conductive layer 290D may be approximately a (slow-wave) wavelength. The outer edge of the inner region 291A and the inner edge of the outer region 291B may, for instance, be separated by approximately a half-wavelength in the radial direction. This exemplary configuration can permit greater power deposition in the edge region of the plasma. This configuration is merely an example, and should not limit the scope of the invention.

The electrically conductive layer 290 (290A, 290B, 290C, 290D) can, for example, comprise a metal. Additionally, the electrically conductive layer 290 (290A, 290B, 290C, 290D) is fabricated from one or more of hafnium, zirconium, titanium, or doped silicon, or a combination of two or more thereof.

Figure 7A:
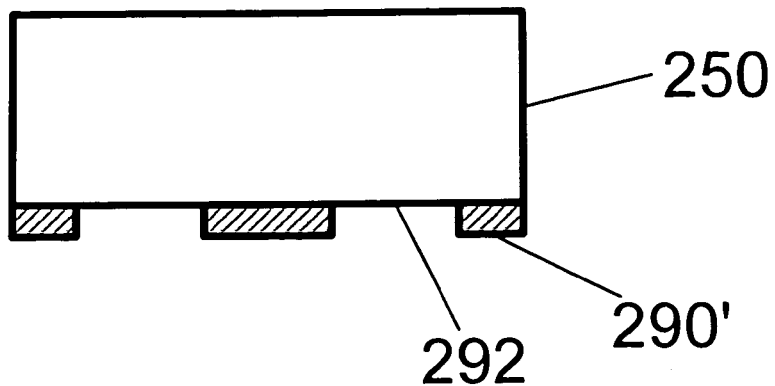
FIGS. 7A through 7D provide a plan view of an antenna reflector pattern according to several embodiments.

Referring now to FIG. 7A, an enlarged cross-sectional view of the plasma surface of resonator plate 250 is shown according to one embodiment. An electrically conductive layer 290' may be vapor deposited on the resonator plate 250. For example, the electrically conductive layer 290' may comprise a metal deposited using a physical vapor deposition (PVD) technique or a chemical vapor deposition (CVD) technique. Alternatively, the electrically conductive layer 290 can include a vapor deposited layer of silicon, wherein a dopant is added. The openings 292 may be formed using a dry etching process or a wet etching process. According to another embodiment, the electrically conductive layer 290' may comprise a separate piece that is mechanically coupled to the plasma surface of resonator plate 250. The thickness of the electrically conductive layer 290' should be adequate for EM wave (i.e., microwave) reflection, as would be understood by one skilled in the art of EM wave propagation.

As illustrated in FIG. 7A, the thickness of resonator plate 250 is the same in both regions where the electrically conductive layer 290' extends and where openings 292 exist. Therefore, the Q (a high Q) for the resonator plate 250 is the same in both regions; however, the Q local to openings 292 can vary as the resonator plate 250 in these regions erodes.

Figure 7B:
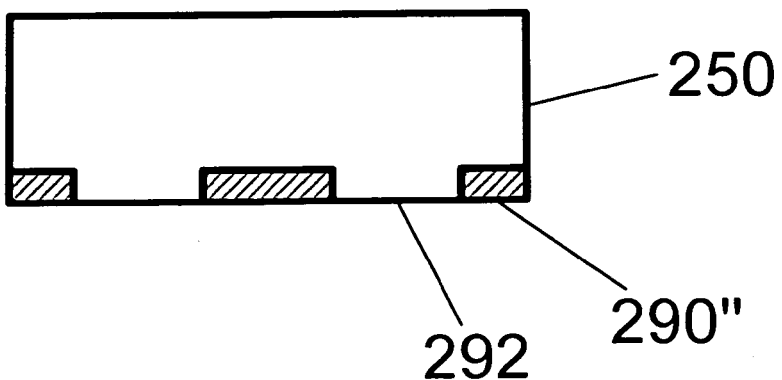

Referring now to FIG. 7B, an enlarged cross-sectional view of the plasma surface of resonator plate 250 is shown according to another embodiment. An electrically conductive layer 290" may be formed as described in FIG. 7A. Furthermore, a dielectric material is deposited over the electrically conductive layer 290" in order to fill the openings 292 as shown (e.g., blanket deposition followed by planarization). The dielectric material can comprise the same composition as the resonator plate, or the dielectric material can comprise a different composition as the resonator plate 250. For example, the resonator plate 250 can comprise quartz, and the dielectric material deposited on the resonator plate 250 can comprise quartz. As illustrated in FIG. 7B, the thickness of resonator plate 250 is not the same in both regions where the electrically conductive layer 290" extends and where openings 292 exist. Therefore, the Q (a high Q) for the resonator plate 250 is different, i.e., a high Q is designed for regions where the electrically conductive layer 290" extends and the openings 292 comprise a relatively lower Q. Although, the Q local to openings 292 can vary as the resonator plate 250 erodes in these regions, the Q is initially low and, hence, it varies little as the resonator plate dimension changes in these regions.

Figure 7C:
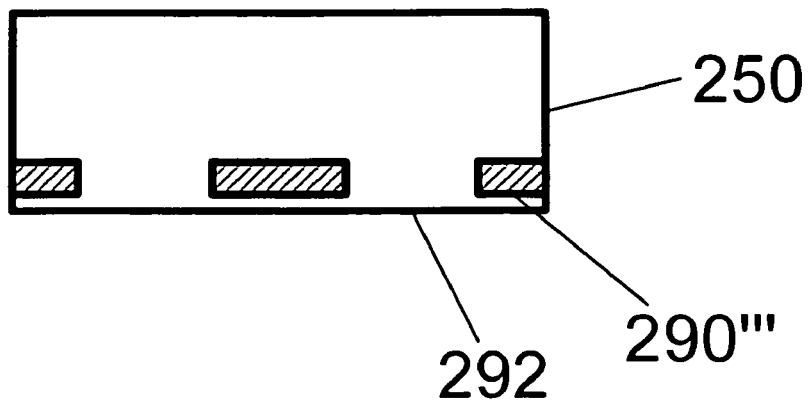

Referring now to FIG. 7C, an enlarged cross-sectional view of the plasma surface of resonator plate 250 is shown according to another embodiment. An electrically conductive layer 290''' may be formed as described in FIG. 7A. Furthermore, a dielectric material is deposited over the electrically conductive layer 290''' in order to fill the openings 292 as shown and provide a protective barrier over the electrically conductive layer 290'''. The dielectric material can comprise the same composition as the resonator plate, or the dielectric material can comprise a different composition as the resonator plate 250. For example, the resonator plate 250 can comprise quartz, and the dielectric material deposited on the resonator plate 250 can comprise quartz. In one embodiment, the dielectric material is vapor deposited. For example, a thin $SiO_2$ layer, such as a 2 micron layer of thermal $SiO_2$ or a 6 micron layer of physical vapor deposition (PVD) $SiO_2$, can be deposited on the lower surface of the resonator plate 250. In another embodiment, the dielectric material comprises a disc of material that is fused with the resonator plate. For example, the disc of material can comprise a quartz disc that may be fused (or bonded) to a quartz resonator plate by applying a quartz frit to one surface of either the resonator plate 250 or the disc of material and thermally treating the sandwiched quartz pieces.

As illustrated in FIG. 7C, the thickness of resonator plate 250 is not the same in both regions where the electrically conductive layer 290''' extends and where openings 292 exist. Therefore, the Q (a high Q) for the resonator plate 250 is different, i.e., a high Q is designed for regions where the electrically conductive layer 290''' extends and the openings 292 comprise a relatively lower Q. Although, the Q local to openings 292 can vary as the resonator plate 250 erodes in these regions, the Q is initially low and, hence, it varies little as the resonator plate dimension changes in these regions.

Figure 7D:
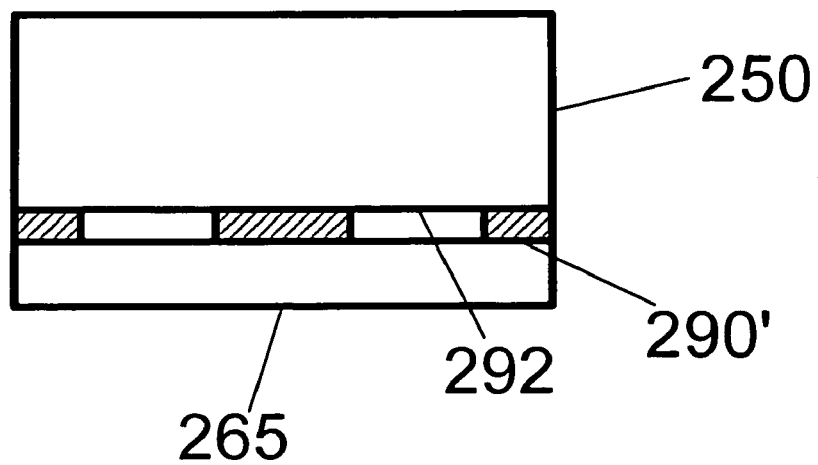

Referring now to FIG. 7D, an exploded cross-sectional view of the plasma surface of resonator plate 250 is shown according to another embodiment. A cover plate 265, such as the one described in FIG. 4, may be coupled to the resonator plate 250 and the electrically conductive layer 290. The cover plate can be coupled to any one of the embodiments depicted in FIGS. 6A through 6C. The thickness of the cover plate 265 can range from approximately 0.5 mm to approximately 10 mm and, desirably, the thickness can range from approximately 1 mm to approximately 2 mm.

Referring still to FIG. 5, the electrically conductive layer 290 may be coupled to electrical ground. Alternatively, the electrically conductive layer 290 may be coupled to a DC voltage. For example, the electrically conductive layer 290 can be coupled to a DC power system (not shown). The DC power supply can include a variable DC power system. Additionally, the DC power supply can include a bipolar DC power system. The DC power system can further include a system configured to perform at least one of monitoring adjusting, or controlling the polarity, current, voltage, or on/off state of the DC power system. Once plasma is formed, the DC power system can facilitate the formation of a ballistic electron beam. An electrical filter may be utilized to de-couple (microwave) AC power from the DC power supply.

For example, the DC voltage applied to electrically conductive layer 290 by DC power supply may range from approximately −2000 volts (V) to approximately 1000 V. Desirably, the absolute value of the DC voltage has a value equal to or greater than approximately 100 V, and more desirably, the absolute value of the DC voltage has a value equal to or greater than approximately 500 V. Additionally, it is desirable that the DC voltage has a negative polarity.

As is described in published US patent application no. 2006/0037701A1 and published US patent application no. 2006/0037703A1, the application of negative DC power to the plasma processing system affects the formation of a ballistic (or collision-less) electron beam that strikes the surface of substrate 125. Such a ballistic electron beam can provide desirable process conditions in the plasma processing system, particularly for etching processes.

Thus, the present inventors have discovered that the use of an electrically conductive layer having a plurality of openings coupled to the resonator plate may provide certain advantages, such as preservation of high-Q regions in the resonator plate, reduced mode jumping, improved control of plasma uniformity, enhanced plasma properties, etc. It is to be understood however, that the present invention is not limited to providing all or any one of the above advantages. For example, the use of the electrically conductive layer may provide unknown advantages that can be exploited to the exclusion of any one or all of the above described advantages.

Figure 8:
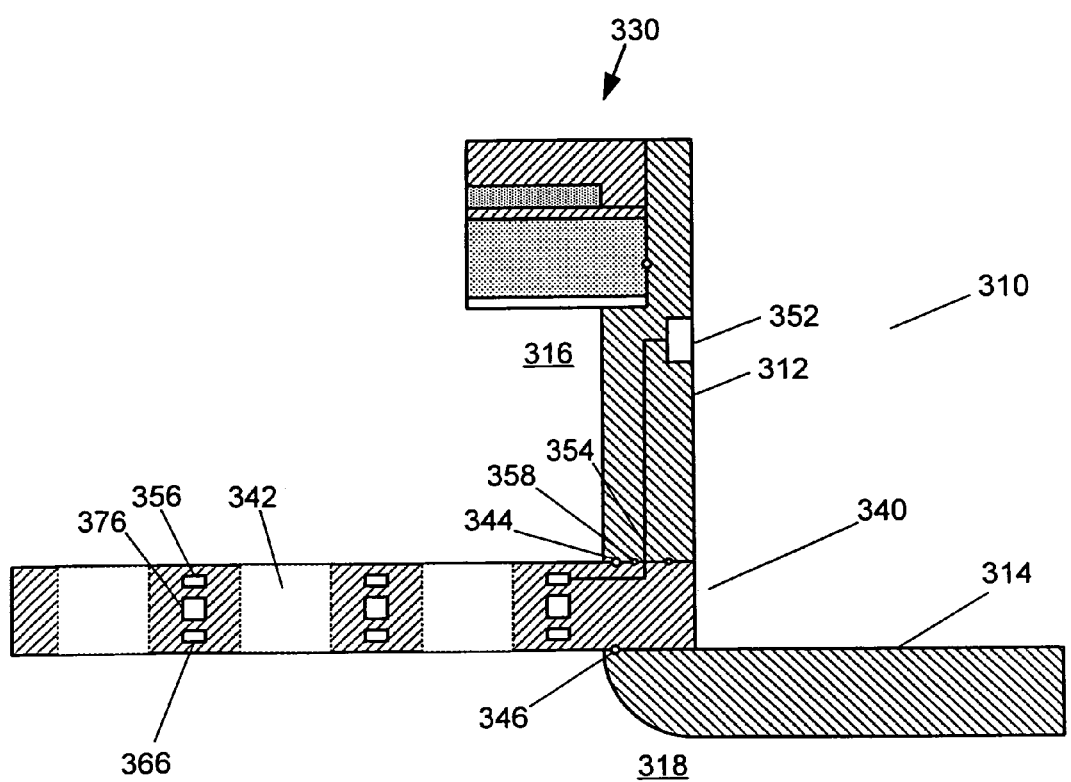
FIG. 8 provides an exploded view of a portion of a processing chamber according to an embodiment.

Referring again to FIG. 1B, as indicated above, the grid 140 may be configured to control process uniformity in the plasma processing system. Specifically, the grid 140 may be implemented as a gas injection grid for introducing the first and second gasses. FIG. 8 illustrates a portion of a processing system showing details of a gas injection grid in accordance with one embodiment. A processing chamber 310 is depicted comprising an upper chamber portion 312 that encloses a plasma space 316, and a lower chamber portion 314 that encloses a process region 318. A plasma source 330, such as a surface wave plasma source as described above, is coupled to the upper chamber portion 312, and is configured to form plasma in plasma space 316. A gas injection grid 340 is coupled to the upper chamber portion 312 and the lower chamber portion 314, and located between the plasma space 316 and the process space 318. As illustrated in FIG. 8, the gas injection grid 340 is coupled to the upper chamber portion 312, and it is sealed for use in vacuum using an upper sealing device 344, such as an elastomer O-ring. Also, as illustrated in FIG. 8, the gas injection grid 340 is coupled to the lower chamber portion 314, and it is sealed for use in vacuum using a lower sealing device 346, such as an elastomer O-ring.

The gas injection grid 340 comprises one or more passageways 342 coupling the plasma space 316 to the process space 318 that allow plasma to diffuse into the process space 318. In the embodiment of FIG. 8, gas injection grid 340 is configured to introduce a first gas to the plasma space 316 through one or more gas injection orifices (not shown) that are coupled to a first gas channel array 356. The first gas channel array 356 can include one gas channel coupled to a first gas supply system, or a plurality of gas channels forming multiple zones in the gas injection grid 340 that are independently coupled to the first gas supply system. In the latter, the composition of the first gas, or the flow rate of the first gas, or both can be varied from one gas channel to the next. By such variation, a condition of the plasma in plasma space 316 can be spatially controlled to achieve spatial uniformity or non-uniformity as desired. For example, spatial uniformity of the plasma may be used to maintain process uniformity, and non-uniformity of the plasma may be used to compensate for other conditions in the processing system.

As also seen in the embodiment of FIG. 8, gas injection grid 340 is configured to introduce a second gas to the process space 318 through one or more gas injection orifices (not shown) that are coupled to a second gas channel array 366. The second gas channel array 366 can include one gas channel coupled to a second gas supply system, or a plurality of gas channels independently coupled to the second gas supply system. In the latter, the composition of the second gas, or the flow rate of the second gas, or both can be varied from one gas channel to the next. As with the first gas, such variation can be used to provide spatial control of the process gas space to achieve spatial uniformity or non-uniformity as desired.

Also in the embodiment of FIG. 8, the temperature of the gas injection grid 340 can be controlled by circulating a heat transfer fluid through a fluid channel array 376 in order to transfer heat from the gas injection grid 340 to a heat exchanger (not shown) when cooling, or to transfer heat to the gas injection grid 340 from the heat exchanger when heating. The fluid channel array 376 can include one fluid channel coupled to a temperature control system, or a plurality of fluid channels independently coupled to the temperature control system. In the latter, the composition of the heat transfer fluid, or the temperature of the heat transfer fluid, or the flow rate of the heat transfer fluid, or any combination thereof can be varied from one fluid channel to the next. Thus, the fluid channel array 376 can also be used to provide spatial control of the plasma and process spaces.

As illustrated in FIG. 8, the first gas is coupled to the first gas channel array 356 via a first array of gas lines 354. The first gas is coupled to the first array of gas lines 354 through a first array of gas fittings 352, which permits a point for coupling a first gas supply system, such as the first gas supply system 150 depicted in FIG. 1B. For example, the first array of gas fittings 352 can be located in the upper chamber portion 312, and the first array of gas lines 354 can pass through the upper chamber portion 312 into the gas injection grid 340, whereby a first array of gas sealing devices 358 are utilized to prevent leakage of the first gas. For example, the first array of gas sealing devices 358 can include one or more elastomer O-rings.

Figure 9:
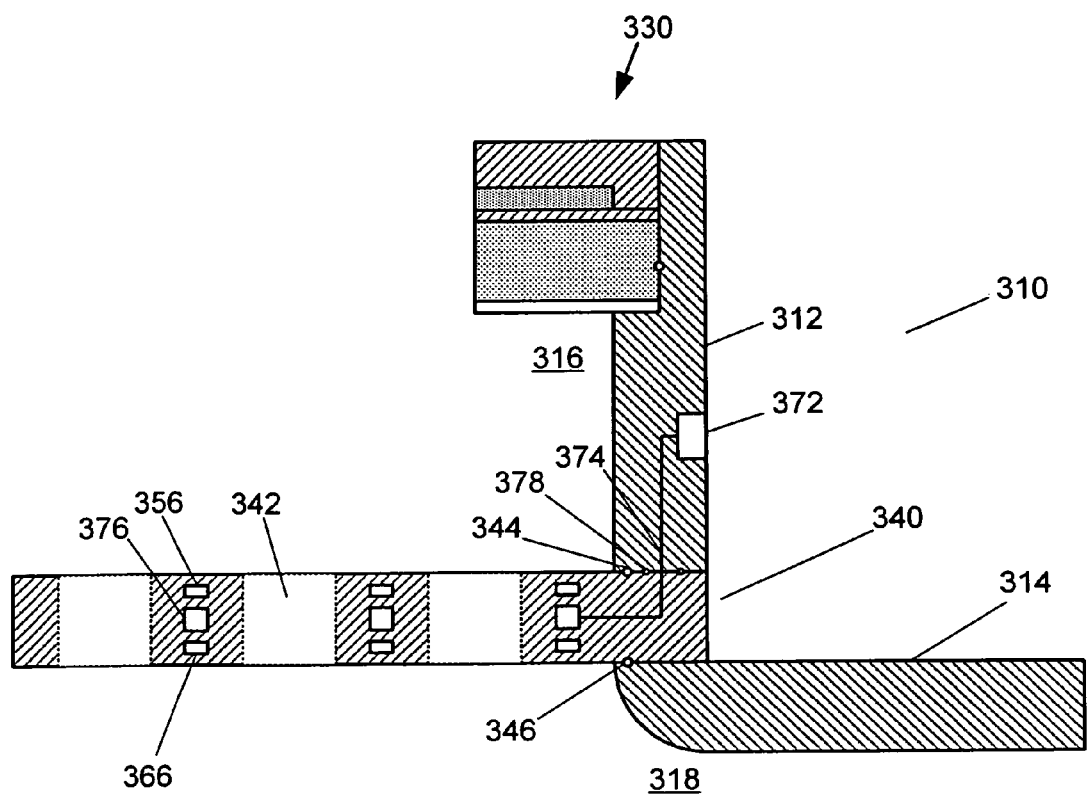
FIG. 9 provides an exploded view of a portion of a processing chamber according to another embodiment.

As illustrated in FIG. 9, the second gas is coupled to the second gas channel array 366 via a second array of gas lines 364. The second gas is coupled to the second array of gas lines 364 through a second array of gas fittings 362, which permits a point for coupling a second gas supply system, such as the second gas supply system 160 depicted in FIG. 1B. For example, the second array of gas fittings 362 can be located in the upper chamber portion 312, and the second array of gas lines 364 can pass through the upper chamber portion 312 into the gas injection grid 340, whereby a second array of gas sealing devices 368 are utilized to prevent leakage of the second gas. For example, the second array of gas sealing devices 368 can include one or more elastomer O-rings.

Figure 10:
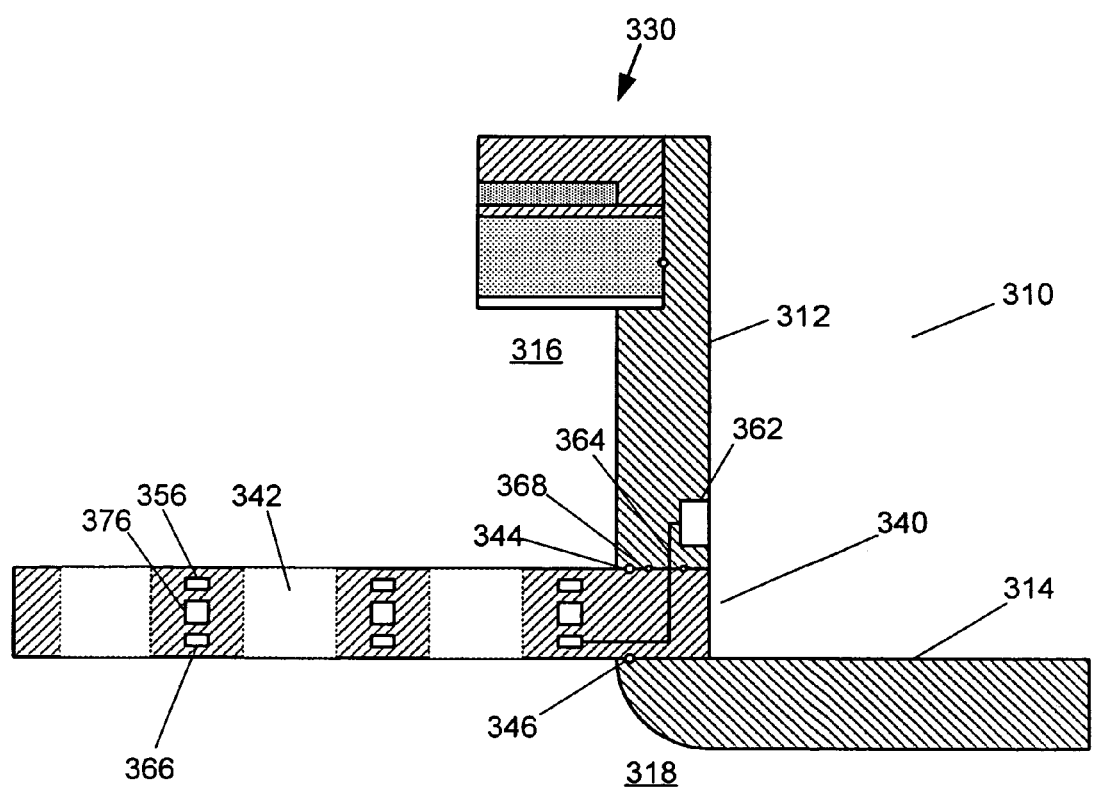
FIG. 10 provides an exploded view of a portion of a processing chamber according to another embodiment.

Additionally, as illustrated in FIG. 10, the heat transfer fluid is coupled to the fluid channel array 376 via an array of fluid lines 374. The heat transfer fluid is coupled to the array of fluid lines 374 through an array of fluid fittings 372, which permits a point for coupling a temperature control system, such as the temperature control system 170 depicted in FIG. 1B. For example, the array of fluid fittings 372 can be located in the upper chamber portion 312, and the array of fluid lines 374 can pass through the upper chamber portion 312 into the gas injection grid 340, whereby an array of fluid sealing devices 378 are utilized to prevent leakage of the heat transfer fluid. For example, the array of fluid sealing devices 378 can include one or more elastomer O-rings.

Figure 11:
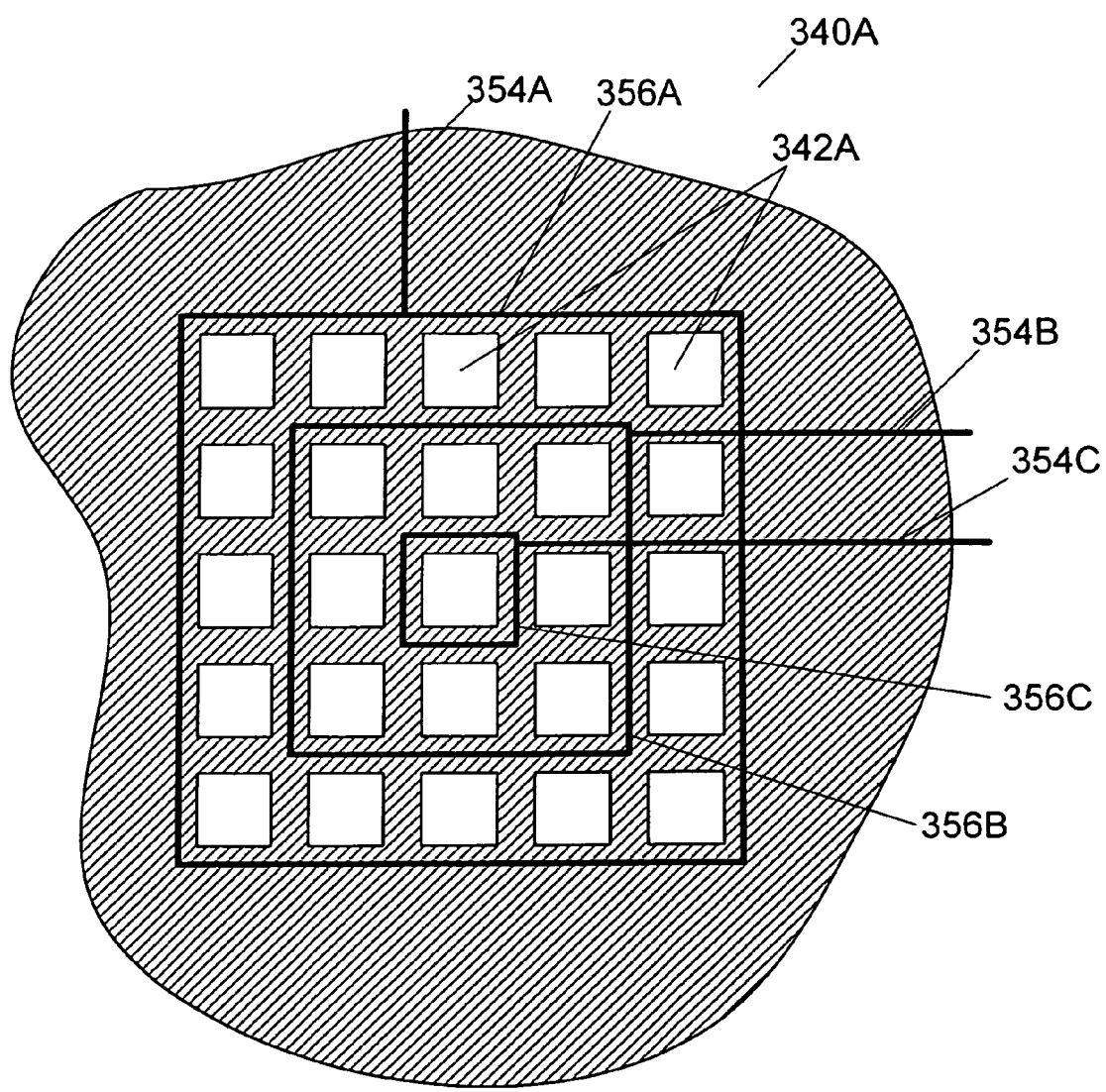
FIG. 11 illustrates a top view of a gas injection grid according to an embodiment.
Figure 12:
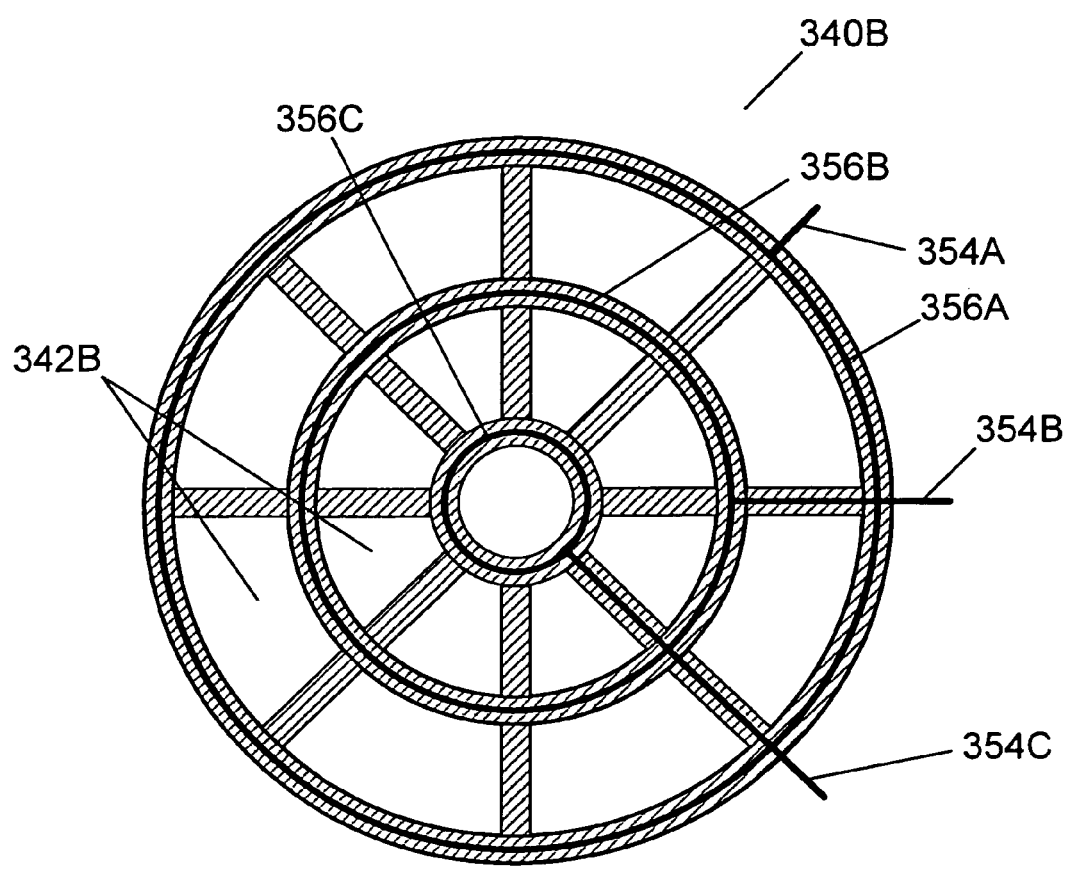
FIG. 12 illustrates a top view of a gas injection grid according to another embodiment.

Thus, as discussed above, one embodiment of the gas injection grid allows the first gas channel array, second gas channel array and/or third gas channel array to be used to provide spatial control of conditions in the process chamber. This spatial control can be used to replace or augment the control techniques of the process chambers described above in order to improve spatial control of processes at the substrate surface. FIGS. 11 and 12, illustrate a top down view of a gas injection grid for providing improved spatial control in accordance with two embodiments of the invention.

In FIG. 11, a gas injection grid 340A is depicted, wherein the gas injection grid comprises a rectangular distribution of passageways 342A, however, different shape passageways can be used. In the example of FIG. 11, the first gas is independently coupled to three gas channels 356A, 356B, and 356C via three separate gas lines 354A, 354B, and 354C. Similarly, in FIG. 12, a gas injection grid 340B is depicted, wherein the gas injection grid comprises a circular distribution of passageways 342B. For example, as shown in FIG. 12, the first gas is independently coupled to three gas channels 356A, 356B, and 356C via three separate gas lines 354A, 354B, and 354C. Although not shown, a separate mass flow controller, or separate array of mass flow controllers can be coupled to each gas line in FIGS. 11 and 12 to allow use of different gas compositions and/or flow rates across the gas injection grid 340A. While FIG. 11 shows closed rectangular loops and FIG. 12 shows closed circular loops that are concentrically spaced and each provided with a gas supply, the present invention is limited to this configuration. For example, each side of the rectangular gas channels in FIG. 11 may be provided with a separate gas supply in order to provide a greater degree of spatial control. Moreover, while FIGS. 11 and 12 are upper views of the gas injection grid 340 showing the gas channels and gas lines of the first gas, the spatial configuration of FIGS. 11 and 12 may be used for the second gas channel array or fluid channel array. In addition, different spatial control configurations can be used for each of these channel arrays if desired.

The gas injection grid 340 (340A, 340B), depicted in FIGS. 8 through 12 can be fabricated from a metal, such as aluminum, or a ceramic, such as alumina. Alternatively, the gas injection grid 340 can be fabricated from quartz, silicon, silicon carbide, silicon nitride, aluminum nitride, or carbon. Additionally, the gas injection grid 340 can be protected with a coating. For example, the coating can comprise one of a surface anodization, a coating formed using plasma electrolytic oxidation, or a spray coating such as a thermal spray coating. In an example, the coating can comprise at least one of $Al_2O_3$ and $Y_2O_3$. In another example, the coating comprises at least one of a III-column element (column III of periodic table) and a Lanthanon element. In another example, the III-column element comprises at least one of Yttrium, Scandium, and Lanthanum. In another example, the Lanthanon element comprises at least one of Cerium, Dysprosium, and Europium. In another embodiment, the compound forming the coating comprises at least one of Yttria ($Y_2O_3$), $Sc_2O_3$, $Sc_2F_3$, $YF_3$, $La_2O_3$, $CeO_2$, $Eu_2O_3$, and $DyO_3$. In another example, the coating can comprise Keronite (surface coating treatment commercially available from Keronite Limited, Advanced Surface Technology, PO Box 700, Granta Park, Great Abington, Cambridge CB1 6ZY, UK). In another example, the coating can comprise at least one of silicon, silicon carbide, alumina, Teflon, Vespel, or Kapton.

Referring again to FIGS. 1A and 1B, substrate 125 can be affixed to the substrate holder 120 via a mechanical clamping system, or an electrical clamping system, such as an electrostatic clamping system. Furthermore, substrate holder 120 can further include a cooling system including a re-circulating coolant flow that receives heat from substrate holder 120 and transfers heat to a heat exchanger system (not shown), or when heating, transfers heat from the heat exchanger system. Moreover, gas can be delivered to the back-side of substrate 125 via a backside gas system to improve the gas-gap thermal conductance between substrate 125 and substrate holder 120. Such a system can be utilized when temperature control of the substrate is required at elevated or reduced temperatures. For example, the backside gas system can comprise a two-zone gas distribution system, wherein the helium gas gap pressure can be independently varied between the center and the edge of substrate 125. In other embodiments, heating/cooling elements, such as resistive heating elements, or thermo-electric heaters/coolers can be included in the substrate holder 120, as well as the chamber wall of the processing chamber 110 and any other component within the plasma processing system 100 (or 100').

Furthermore, substrate holder 120 can comprise an electrode through which radio frequency (RF) power is coupled to the processing plasma in process space 118. For example, substrate holder 120 can be electrically biased at a RF voltage via the transmission of RF power from a RF generator (not shown) through an impedance match network (not shown) to substrate holder 120. A typical frequency for the RF bias can range from about 0.1 MHz to about 100 MHz. RF bias systems for plasma processing are well known to those skilled in the art. Alternately, RF power is applied to the substrate holder electrode at multiple frequencies. Furthermore, impedance match network serves to improve the transfer of RF power to plasma in plasma processing chamber 110 by reducing the reflected power. Match network topologies (e.g. L-type, π-type, T-type, etc.) and automatic control methods are well known to those skilled in the art.

The temperature control system 170 of exemplary FIG. 1B can include components necessary for controlling the temperature of the gas injection grid 140. For example, the temperature control system 170 can include a heat exchanger for controlling the temperature of a heat transfer fluid, a pump and mass flow controller for delivering and controlling the flow rate of the heat transfer fluid to one or more channels in the gas injection grid 140, temperature sensing devices, a controller, etc.

The electric bias control system 175 can include components necessary for electrically biasing the gas injection grid 140. The electric bias can include a direct current (DC) electrical bias, or an alternating current (AC) electrical bias, or a combination thereof. For example, the electrical bias may include a radio frequency (RF) electric bias. The electric bias control system 175 can include a voltage/current source or power source, voltage or current or impedance measuring devices, a controller, etc.

The pumping system 180 of exemplary FIGS. 1A and 1B can include a turbo-molecular vacuum pump (TMP) capable of a pumping speed up to about 5000 liters per second (and greater) and a gate valve for throttling the chamber pressure. In conventional plasma processing devices utilized for dry plasma etch, a 1000 to 3000 liter per second TMP is generally employed. Moreover, a device for monitoring chamber pressure (not shown) can be coupled to the processing chamber 110. The pressure measuring device can be, for example, a Type 628B Baratron absolute capacitance manometer commercially available from MKS Instruments, Inc. (Andover, Mass.).

Still referring to FIGS. 1A and 1B, control system 190 can comprise a microprocessor, memory, and a digital I/O port capable of generating control voltages sufficient to communicate and activate inputs to plasma processing system 100 (or 100') as well as monitor outputs from plasma processing system 100 (or 100'). Moreover, the controller 190 may be coupled to and may exchange information with the processing chamber 110, substrate holder 120, plasma source 130, gas injection grid 140, first gas supply 150, second gas supply 160, temperature control system 170, electric bias control system 175, and pumping system 180. For example, a program stored in the memory may be utilized to activate the inputs to the aforementioned components of the plasma processing system 100 according to a process recipe in order to perform an etching process, or a deposition process. One example of the controller 190 is a DELL PRECISION WORKSTATION 610™, available from Dell Corporation, Austin, Tex.

The controller 190 may be locally located relative to the plasma processing system 100 (or 100'), or it may be remotely located relative to the plasma processing system 100 (or 100'). For example, the controller 190 may exchange data with the plasma processing system 100 (or 100') using at least one of a direct connection, an intranet, the Internet and a wireless connection. The controller 190 may be coupled to an intranet at, for example, a customer site (i.e., a device maker, etc.), or it may be coupled to an intranet at, for example, a vendor site (i.e., an equipment manufacturer). Additionally, for example, the controller 190 may be coupled to the Internet. Furthermore, another computer (i.e., controller, server, etc.) may access, for example, the controller 190 to exchange data via at least one of a direct connection, an intranet, and the Internet. As also would be appreciated by those skilled in the art, the controller 190 may exchange data with the plasma processing system 100 (or 100') via a wireless connection.

Figure 13:
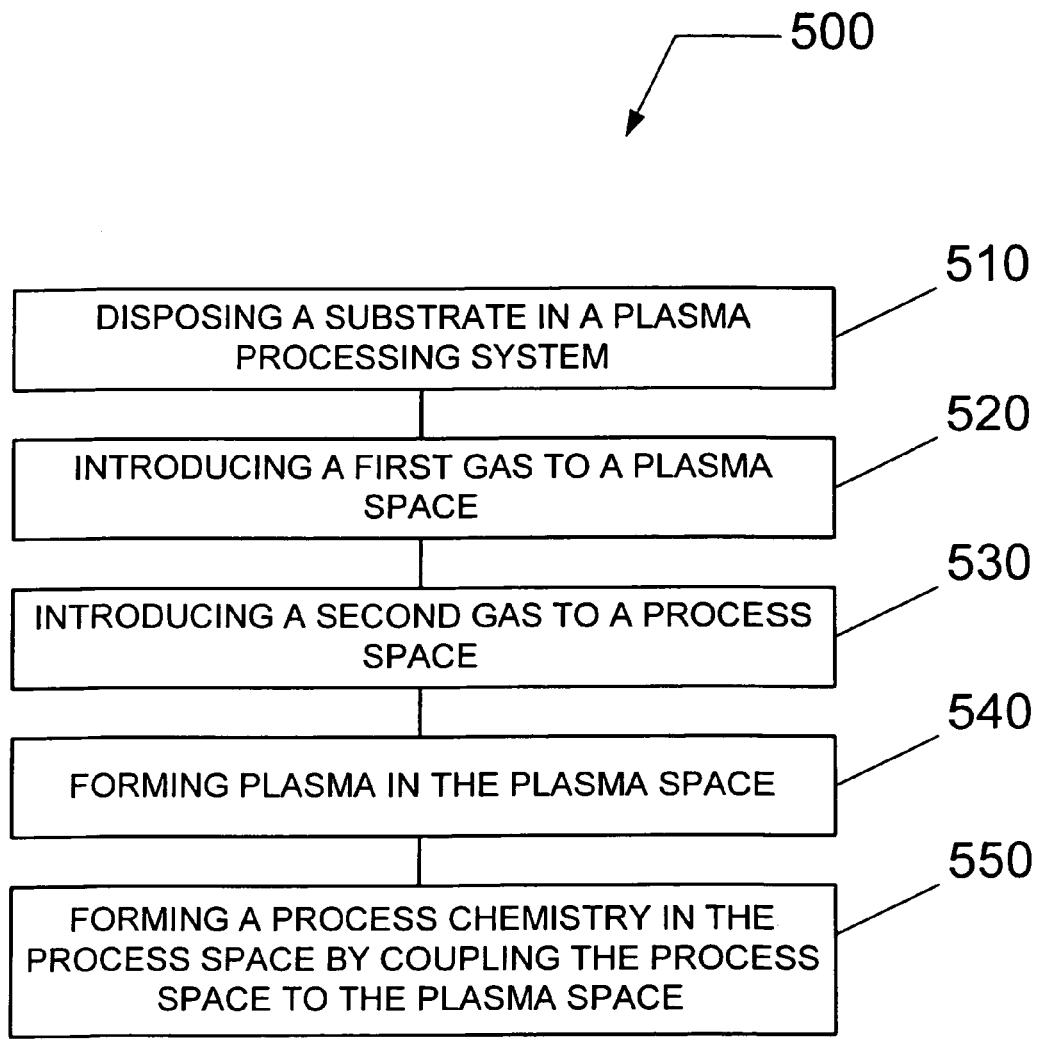
FIG. 13 provides a method of operating a plasma processing system according to an embodiment.

Referring now to FIG. 13, a method of operating a plasma processing system is described. The method includes a flow chart 500 beginning in 510 with disposing a substrate in a plasma processing system, such as the plasma processing system described in any of FIGS. 1 through 12. For example, a substrate can be disposed in a processing chamber having an upper chamber portion configured to define a plasma space and a lower chamber portion configured to define a process space.

In 520, a first gas is introduced to the plasma space from a gas injection grid positioned between the upper chamber portion and the lower chamber portion as described above, or by alternative gas injection schemes. The first gas comprises plasma forming gas, or an ionizable gas. For example, the first gas can include an inert gas, such as a Noble gas (i.e., helium, argon, xenon, krypton, neon). In 530, a second gas is introduced to the process space from the gas injection grid or any other gas injection scheme. The second gas comprises a process gas. For example, the second gas can include a halogen containing gas, such as $Cl_2$, HBr, $SF_6$, $NF_3$, etc. Additionally, for example, the second gas can include a $C_xF_y$ containing gas, such as $CF_4$, $C_4F_6$, $C_4F_8$, $C_5F_8$, where x and y are integers greater than or equal to unity. The first or second gas may be injected using spatial control techniques such as those described above.

In 540, plasma is formed in the plasma space from the first gas using a plasma source coupled to the upper chamber portion. The plasma source may be any of the sources described above. In 550, process chemistry is formed in the process space to treat the substrate by coupling the process space to the plasma space through a grid such as the gas injection grid, which allows diffusion of the plasma into the process space as described above.

Figure 14:
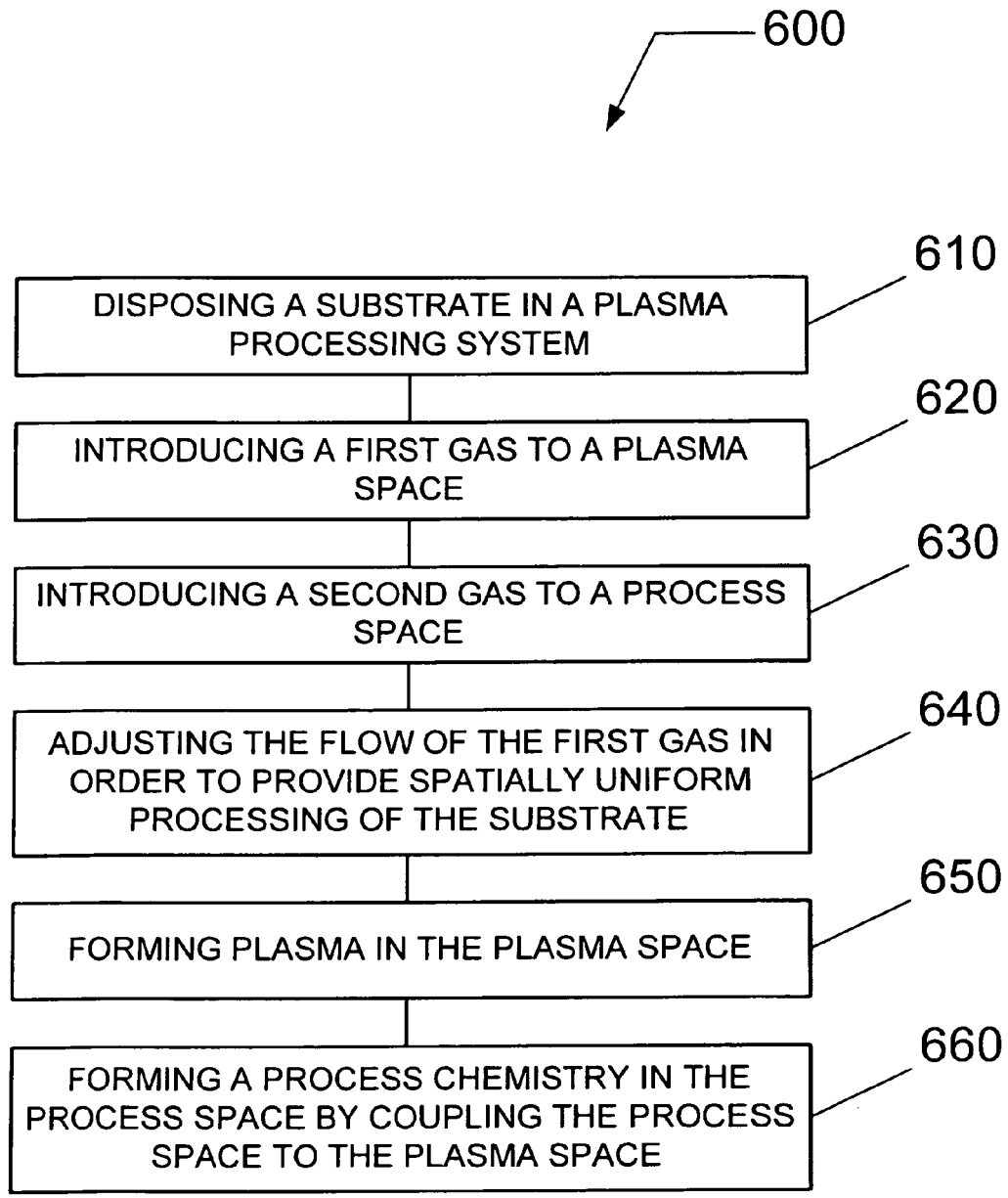
FIG. 14 provides a method of controlling the uniformity in a plasma processing system according to an embodiment.

Referring now to FIG. 14, a method of controlling the uniformity in a plasma processing system is provided according to an embodiment. The method comprises a flow chart 600 beginning in 610 with disposing a substrate in a plasma processing system, such as the plasma processing system described in any of FIGS. 1 through 12. For example, a substrate can be disposed in a processing chamber having an upper chamber portion configured to define a plasma space and a lower chamber portion configured to define a process space.

In 620, a first gas is introduced to the plasma space from a gas injection grid positioned between the upper chamber portion and the lower chamber portion. Optionally, the introduction of the first gas into the plasma space occurs from multiple zones formed in the gas injection grid as described above. Each zone for introducing the first gas includes a gas channel formed in the gas injection grid having one or more injection orifices, and the gas channel is independently coupled to a first gas supply system. Each zone can, for example, be formed in the radial directions, as illustrated in FIGS. 11 and 12, however, other spatial distributions can be used as described above. Such configurations allow for different flow rates and/or gas compositions across the grid.

In 630, a second gas is introduced to the process space from the gas injection grid. Optionally, the introduction of the second gas into the plasma space occurs from multiple zones formed in the gas injection grid as described above. Where the first gas is introduced without spatial control, the second gas is introduced with spatial control. It is only necessary that one of the first and second gasses is injected by a method for providing spatial control, however both gasses can be injected in this way. Moreover, spatial temperature control may be provided as discussed above. Each zone for introducing the second gas includes a gas channel formed in the gas injection grid having one or more injection orifices, and the gas channel is independently coupled to a second gas supply system. Each zone can, for example, be formed in the radial directions, similar to the scheme illustrated for the first gas in FIGS. 11 and 12.

In 640, the flow of the first gas into the plasma space is adjusted in order to provide spatial control of processing of the substrate. In a preferred embodiment, spatially uniform processing is achieved at the substrate. The local flow rate of the first gas into the plasma space can either raise or lower the local plasma density. For example, during high power operation of the plasma source, the hot plasma can be super heated, and therefore an increase in flow rate can lead to an excess of ionization of the first gas (i.e., plasma density increases). Alternatively, for example, during low power operation of the plasma source, the hot plasma is sustaining itself, and an increase in the flow rate can lead to quenching of the electron temperature (i.e., quenching of the collisions between neutrals and electrons), thus leading to a reduction in the plasma density. In one example, the gas injection grid can include, as described above, multiple zones for introducing the first gas into the plasma space. The flow rate for each zone can be utilized within the process recipe, for an etch or deposition process, in order to achieve the optimal spatial distribution of the plasma density in the plasma space for the specific process. For instance, a design of experiment (DOE) can be performed to determine the optimal set of flow rates for each of the zones to produce the optimal results.

Optionally, the flow of the second gas into the process space is adjusted in order to provide spatially uniform processing of the substrate.

In 650, plasma is formed in the plasma space from the first gas using a plasma source coupled to the upper chamber portion. In 660, process chemistry is formed in the process space to treat the substrate by coupling the process space to the plasma space through the gas injection grid.

Although only certain exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

What is claimed is:

1. A plasma processing system which etches a substrate, comprising:
    a microwave power coupling system including a microwave source which produces microwave energy at 2.45 GHz and a coaxial feed;
    a plasma processing chamber which facilitates the formation of plasma from process gas introduced therein;
    a substrate holder coupled to said plasma processing chamber and which supports said substrate;
    an electromagnetic (EM) wave launcher coupled to said microwave power coupling system and said plasma processing chamber, the EM wave launcher couples EM energy in a desired EM wave mode to a plasma by generating a surface wave on a plasma surface of said EM wave launcher adjacent said plasma, said EM launcher including
    a slot antenna with a first end coupled to an inner conductor of said coaxial feed and a second end coupled to an outer conductor of said coaxial feed, said slot antenna includes one or more slots which couples said EM energy from a first region above said slot antenna between said inner conductor and said outer conductor to a second region below said slot antenna,
    a slow wave plate positioned in said first region and which reduces the effective wavelength of said EM energy relative to the wavelength in free space, and
    a resonator plate positioned in said second region below said slot antenna, a lower surface of said resonator plate including said plasma surface of the EM wave launcher and an upper surface of said resonator plate abutting a lower surface of said slot antenna;
    an electrically conductive layer deposited on said lower surface of said resonator plate of said EM wave launcher so as to protect said lower surface of said resonator plate, wherein said electrically conductive layer comprises a plurality of openings to permit the passage of EM energy at discrete regions of said EM wave launcher; and a direct current (DC) power source connected to said electrically conductive layer deposited on said lower surface of said resonator plate and which connects a DC voltage to said electrically conductive layer deposited on said lower surface of said resonator plate in order to form a ballistic electron beam that strikes a surface of said substrate.

2. The plasma processing system of claim 1, wherein said power coupling system comprises a microwave power coupling system comprising:

a waveguide coupled to an outlet of said microwave source;

an isolator coupled to said waveguide and which prevents propagation of microwave energy back to said microwave source; and a coaxial converter coupled to said isolator and which couples said microwave energy to said coaxial feed.

3. The plasma processing system of claim 1, wherein said DC power source couples DC power ranging in voltage from approximately −2000 V to approximately 1000 V.

4. The plasma processing system of claim 3, wherein said DC power source couples DC power having a negative polarity and the absolute value of the DC voltage is greater than or equal to approximately 500 V.

5. The plasma processing system of claim 1, wherein said electrically conductive layer is deposited on the lower surface of said resonator plate and a protective layer of material is deposited or fused over said deposited electrically conductive layer.

6. The plasma processing system of claim 1, wherein said electrically conductive layer is embedded within the surface layer of said lower surface of said resonator plate.

7. The plasma processing system of claim 1, wherein said resonator plate comprises a high dielectric constant (high-k) material, said high dielectric constant material having a dielectric constant greater than a value of 4.

8. The plasma processing system of claim 1, wherein said electrically conductive layer includes a metal.

9. The plasma processing system of claim 1, wherein said electrically conductive layer includes hafnium, zirconium, titanium, or doped silicon, or a combination of two or more thereof.

10. The plasma processing system of claim 1, wherein said plurality of openings in said electrically conductive layer are uniformly distributed.

11. The plasma processing system of claim 1, wherein said plurality of openings in said electrically conductive layer are non-uniformly distributed.

12. The plasma processing system of claim 1, further comprising:

a grid coupled to said plasma processing chamber and which separates said plasma processing chamber into a first chamber portion which receives a first gas for providing a plasma space and a second chamber portion which receives a second gas for providing a process space having process chemistry to treat said substrate, wherein said grid is located between said plasma space and said process space, and which permits the diffusion of said plasma between said plasma space and said process space in order to form said process chemistry from said process gas.

13. The plasma processing system of claim 12, wherein said grid comprises one or more passageways for coupling said plasma space to said process space.

14. The plasma processing system of claim 13, wherein said one or more passageways form a rectangular pattern.

15. The plasma processing system of claim 13, wherein said one or more passageways form a circular pattern.

16. The plasma processing system of claim 12, wherein said grid is coupled to a temperature control system which controls the temperature of the grid and said temperature control system comprises one or more fluid channels in said grid which flows a heat transfer fluid.

17. The plasma processing system of claim 16, wherein said one or more fluid channels comprises a plurality of fluid channels which provides spatial temperature control of said grid in order to control uniformity of said process performed in said processing system.

18. The plasma processing system of claim 12, wherein said grid comprises a gas injection grid which injects at least one of said first gas or said second gas and said gas injection grid includes a first gas channel array which provides multiple zones for injecting said first gas into said plasma space to control uniformity of said process performed in said processing system.

19. The plasma processing system of claim 18, wherein said gas injection grid includes a first gas channel array which provides multiple zones for injecting said first gas to control uniformity of said process performed in said processing system.

* * * * *